US010297178B2

(12) United States Patent
Park et al.

(10) Patent No.: US 10,297,178 B2
(45) Date of Patent: May 21, 2019

(54) TRANSPARENT DISPLAY DEVICE

(71) Applicant: LG ELECTRONICS INC., Seoul (KR)

(72) Inventors: Jongmin Park, Seoul (KR); Jaeho An, Seoul (KR); Hyeonjun Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/547,287

(22) PCT Filed: Feb. 6, 2015

(86) PCT No.: PCT/KR2015/001235
§ 371 (c)(1),
(2) Date: Jul. 28, 2017

(87) PCT Pub. No.: WO2016/122041
PCT Pub. Date: Aug. 4, 2016

(65) Prior Publication Data
US 2018/0025679 A1 Jan. 25, 2018

(30) Foreign Application Priority Data
Jan. 29, 2015 (KR) ........................ 10-2015-0014127

(51) Int. Cl.
*G09G 5/00* (2006.01)
*G09F 27/00* (2006.01)
(Continued)

(52) U.S. Cl.
CPC .............. *G09F 27/00* (2013.01); *A47F 3/001* (2013.01); *A47F 3/005* (2013.01); *A47F 3/0434* (2013.01);
(Continued)

(58) Field of Classification Search
CPC . G09F 27/00; G09F 9/30; G09F 23/00; G09F 9/00; G09F 2023/0033;
(Continued)

(56) References Cited

U.S. PATENT DOCUMENTS

| | | | |
|---|---|---|---|
| 5,150,238 | A | 9/1992 | Vogeley et al. |
| 2012/0105424 | A1 | 5/2012 | Lee et al. |

(Continued)

FOREIGN PATENT DOCUMENTS

| | | |
|---|---|---|
| JP | 05181127 | 7/1993 |
| JP | 08001502 | 1/1996 |

(Continued)

OTHER PUBLICATIONS

PCT International Application No. PCT/KR2015/001235, Written Opinion of the International Searching Authority dated Oct. 16, 2015, 19 pages.
IP Australia Application No. 2015210335, Office Action dated Jun. 10, 2016, 3 pages.
Canadian Intellectual Property Office Application No. 2,899,376, Office Action dated Sep. 2, 2016, 3 pages.
(Continued)

*Primary Examiner* — Adam R. Giesy
(74) *Attorney, Agent, or Firm* — Lee, Hong, Degerman, Kang & Waimey PC

(57) ABSTRACT

A transparent display device attached to a predetermined product, displaying article information in the product, advertisement, etc. is disclosed. The transparent display device comprises a frame including an opening; a transparent display panel arranged at the opening; and a control module arranged in an area of the frame to control the transparent display panel, wherein the frame in which the transparent display panel and the control module are arranged is provided to cover a front surface of a predetermined product so as to form a door unit of the predetermined product, and is rotatably moved when the inside of the predetermined product is opened and closed.

20 Claims, 15 Drawing Sheets

(51) Int. Cl.

| | |
|---|---|
| ***G09F 9/00*** | (2006.01) |
| ***A47F 3/00*** | (2006.01) |
| ***A47F 3/04*** | (2006.01) |
| ***G09F 9/30*** | (2006.01) |
| ***G09F 23/00*** | (2006.01) |
| ***G09G 3/20*** | (2006.01) |
| ***H05K 5/00*** | (2006.01) |
| ***H05K 5/03*** | (2006.01) |
| ***G09F 23/04*** | (2006.01) |
| ***G09F 23/06*** | (2006.01) |

(52) U.S. Cl.
CPC .................. *G09F 9/00* (2013.01); *G09F 9/30* (2013.01); *G09F 23/00* (2013.01); *G09F 23/04* (2013.01); *G09F 23/06* (2013.01); *G09F 27/005* (2013.01); *G09G 3/2096* (2013.01); *H05K 5/0017* (2013.01); *H05K 5/03* (2013.01); *G09F 2023/0033* (2013.01); *G09G 2320/0626* (2013.01); *G09G 2330/02* (2013.01); *G09G 2354/00* (2013.01); *G09G 2380/06* (2013.01)

(58) Field of Classification Search
CPC ...... H05K 5/0017; H05K 5/03; A47F 3/0434; A47F 3/001; A47F 3/005; G09G 3/2096; G09G 2380/06; G09G 2330/02; G09G 2320/0626; G09G 2354/00
See application file for complete search history.

(56) References Cited

U.S. PATENT DOCUMENTS

2014/0078407 A1* 3/2014 Green ...................... G09F 9/35 348/836
2014/0144083 A1* 5/2014 Artwohl ............... A47F 3/0434 49/70
2015/0338715 A1 11/2015 Schaefer et al.
2015/0379905 A1* 12/2015 Kawasaki-Hedges ...................... G09F 19/16 40/427

FOREIGN PATENT DOCUMENTS

| | | |
|---|---|---|
| JP | 08002316 | 1/1996 |
| JP | 2003125904 | 5/2003 |
| JP | 2014503835 | 2/2014 |
| JP | 2014509528 | 4/2014 |
| KR | 101081617 | 11/2011 |
| KR | 1020120044874 | 5/2012 |
| KR | 1020130115586 | 10/2013 |
| KR | 1020140062920 | 5/2014 |
| WO | 2012057457 | 5/2012 |
| WO | 2012119109 | 9/2012 |
| WO | 2014008903 | 1/2014 |
| WO | 2014006490 | 9/2014 |

OTHER PUBLICATIONS

European Patent Office Application Serial No. 15880222.3, Search Report dated Sep. 13, 2018, 9 pages.

* cited by examiner

TRANSPARENT DISPLAY DEVICE

CROSS-REFERENCE TO RELATED APPLICATIONS

This application is the National Stage filing under 35 U.S.C 371 of International Application No. PCT/KR2015/001235. filed of Feb. 6, 2015, which claims the benefit of earlier filing date and right of priority to Korean Application No. 10-2015-0014127, filed Jan. 29, 2015, the contents of which are all hereby incorporated by reference herein in their entirety.

TECHNICAL FIELD

The present invention relates to a transparent display device, and more particularly, to a transparent display device attached to a predetermined product, displaying article information in the product, advertisement, etc.

BACKGROUND ART

With the development of electronic technology, various display devices have been developed. Display devices, such as CRT, LCD, PDP and OLED, which include various display parts, have been used.

However, the existing display devices have a limitation in that users have no option but to view contents in one direction where a display unit is arranged.

In order to solve such a limitation, studies of a transparent display device have been ongoing.

The transparent display device has an advantage in that a user may view contents displayed on a display unit together with a subject on a rear surface of the display unit as the display unit is transparent.

Also, the transparent display device has an advantage in that a third party located at an opposite side of the user may view contents displayed on the display unit together with the user.

However, as studies of the transparent display device have been focused on development of hardware, studies on how to use the transparent display device and studies of contents development are not sufficient.

Therefore, development of a transparent display device has been required, which is attached to a predetermined product to serve as a door unit and at the same time may display various functions such as article information in the product and advertisement.

DISCLOSURE

Technical Problem

An object of the present invention is to provide a transparent display device that may serve as a door unit by providing a frame in which a transparent display panel and a control module are arranged to cover a front surface of a predetermined product and rotatably moving the frame when the inside of the product is opened and closed, and at the same time may perform various functions such as product information and advertisement.

It will be appreciated by persons skilled in the art that the objects that could be achieved with the present invention are not limited to what has been particularly described hereinabove and the above and other objects that the present invention could achieve will be more clearly understood from the following detailed description.

Technical Solution

According to one embodiment of the present invention, a transparent display device comprises a frame including an opening; a transparent display panel arranged at the opening; and a control module arranged in an area of the frame to control the transparent display panel, wherein the frame in which the transparent display panel and the control module are arranged is provided to cover a front surface of a predetermined product so as to form a door unit of the predetermined product, and is rotatably moved when the inside of the predetermined product is opened and closed.

In this case, the frame may include a front door frame having a first opening, and a rear door frame having a second opening, connected to the front door frame.

Also, the transparent display device further comprises a first transparent cover arranged at a first interval from a front surface of the transparent display panel; and a second transparent cover arranged at a second interval from a rear surface of the transparent display panel. A first spacer for controlling an interval between the first and second transparent covers and an interval between the first transparent cover and the transparent display panel may be arranged at corner areas of the first and second transparent covers, and a second spacer for controlling an interval between the second transparent cover and the transparent display panel may be arranged at the corner area of the second transparent cover.

Also, the control module may include a first interface unit for receiving a signal from an external device; a second interface unit for receiving a signal from a remote controller; and a controller for controlling the transparent display panel in accordance with the signals received from the first and second interface units.

It will be appreciated by persons skilled in the art that that the technical solution that could be achieved with the present invention are not limited to what has been particularly described hereinabove and other technical solutions of the present invention will be more clearly understood from the following detailed description.

Advantageous Effects

According to one embodiment of the present invention, a frame in which a transparent display panel and a control module are arranged is provided to cover a front surface of a predetermined product and rotatably moved when the inside of the product is opened and closed, whereby the frame may serve as a door unit and at the same time perform various functions such as article information in the product and advertisement.

Also, according to the present invention, a control module and a light source module are arranged outside a transparent cover unit, whereby circuit parts may easily be repaired and exchanged with other ones, and mass production may be performed.

Also, according to the present invention, the transparent display panel from which a polarizer and a light guide plate are removed may be used, whereby installation of the transparent display panel is simple due to its light weight, and the production cost may be reduced.

Also, according to the present invention, as an interface unit connected to an external device and a remote controller may be arranged, various contents received from the external device may be displayed, and luminance may be controlled in accordance with a control signal received from the remote controller, whereby user convenience is excellent.

And, according to the present invention, as an audio output unit may be arranged, sound of a contents image displayed on the transparent display panel may be provided, whereby it is easy to advertise and promote the articles.

Therefore, according to the present invention, articles, such as beverages, in the product may be displayed together with advertisement contents to attract consumers' attention and improve a purchase desire of the consumers.

It will be appreciated by persons skilled in the art that that the effects that could be achieved with the present invention are not limited to what has been particularly described hereinabove and other advantages of the present invention will be more clearly understood from the following detailed description.

BEST MODE FOR CARRYING OUT THE INVENTION

Figure 1A:
FIGS. 1*a* to 1*c* are views illustrating a predetermined product to which a transparent display device according to the present invention is provided.

Hereinafter, the present invention will be described in more detail with reference to the accompanying drawings.

A suffix such as "module" and "unit" of elements used in the following description may be given to be merely intended to facilitate description of the specification, and the suffix "module" and "unit" may be used to refer to the same meaning or function.

Moreover, although the embodiments of the present specification will be described in detail with reference to the accompanying drawings and the disclosure described by the drawings, it is to be understood that the present invention is not limited by such embodiments.

Although the terms used in this specification are selected from generally known and used terms considering their functions in the present specification, the terms may be modified depending on intention of a person skilled in the art, practices, or the advent of new technology. Also, in special case, the terms mentioned in the description of the present specification may be selected by the applicant at his or her discretion, the detailed meanings of which are described in relevant parts of the description herein. Accordingly, the terms used herein should be understood not simply by the actual terms used but by the meaning lying within and the description disclosed herein.

Meanwhile, this specification or/and the disclosure disclosed in the drawings are the preferred embodiments according to the present invention, and it is to be understood that the scope of the present invention should be determined through claims.

Hereinafter, a transparent display device disclosed in this specification may include all the devices that perform at least one or more of transmission, reception, processing and output of data, contents, service, application, etc. The transparent display device may be paired or connected (hereinafter, referred to as paired) with another digital device, an external server, etc., through a wire/wireless network to transmit and receive data. At this time, the data may be converted appropriately before transmission and reception. For example, examples of the digital device may include a standing device such as a network TV, a hybrid broadcast broadband TV (HBBTV), a smart TV, an Internet protocol TV (IPTV), and a personal computer (PC), and a mobile device such as a personal digital assistant (PDA), a smart phone, a tablet PC, and a notebook computer.

Meanwhile, the wire/wireless network disclosed in this specification refers to a communication network that supports various communication standards to protocols for pairing or data transmission and reception between the transparent display device and the digital devices or between the transparent display device and the external server. The wire/wireless network includes all of communication networks which will be supported currently or later by the standards, may support all of one or more communication protocols for the communication networks. The wire/wireless network may be formed by networks for wire connection, such as a USB (Universal Serial Bus) terminal, a composite video banking sync (CVBS) terminal, a component terminal, an S-video (analog) terminal, a digital visual interface (DVI) terminal, a high definition multimedia interface (HDMI) terminal, an RGB terminal, and a D-SUB terminal, and communication standards or protocols for the wire network connection, networks for wireless connection, such as Bluetooth, Radio Frequency Identification (RFID), infrared Data Association (IrDA), Ultra Wideband (UWB), ZigBee, Digital Living Network Alliance (DLNA), Wireless LAN (WLAN)(Wi-Fi), Wireless broadband (Wibro), World Interoperability for Microwave Access (Wimax), High Speed Downlink Packet Access (HSDPA), LTE/LTE-A (Long Term Evolution/LTE-Advanced), and Wi-Fi direct, and communication standards or protocols for the wireless network connection.

In addition, if the transparent display device is simply referred in this specification, the transparent display device may mean a fixed device or a mobile device depending on the context, or may mean both a fixed device and a mobile device unless mentioned especially.

In the meantime, the transparent display device is an intelligent device that supports a broadcasting receiving function, a computer function, and at least one external input, and may support e-mailing, web browsing, banking, games, applications, etc. through the aforementioned wire/wireless network. Moreover, the digital device may be provided with an interface for supporting at least one input or control means (hereinafter, referred to as 'input means') such as a manual type input device, a touch screen, a spatial remote controller.

In addition, although the transparent display device may use a standardized general-purpose operating system (OS), especially the transparent display device disclosed in this specification uses a web OS as one embodiment. Therefore, the transparent display device enables processing such as adding, deleting, amending, updating, etc. of various services or applications on a general-purpose OS kernel or Linux kernel, and may provide more user-friendly environment through the processing.

In the meantime, the aforementioned transparent display device may receive and process an inter input. At this time, the external input includes all of input means or digital devices that are connected with an external input device, that is, the aforementioned transparent display device through the wire/wireless network to transmit and receive data. For example, examples of the external input includes HDMI (High-Definition Multimedia Interface), game device such as playstation or X-box, a smart phone, a tablet PC, a printing device such as pocket photo, a smart TV, and all of digital devices such as blu-ray device.

Hereinafter, the present invention will be described in more detail with reference to the accompanying drawings.

Figure 1B:
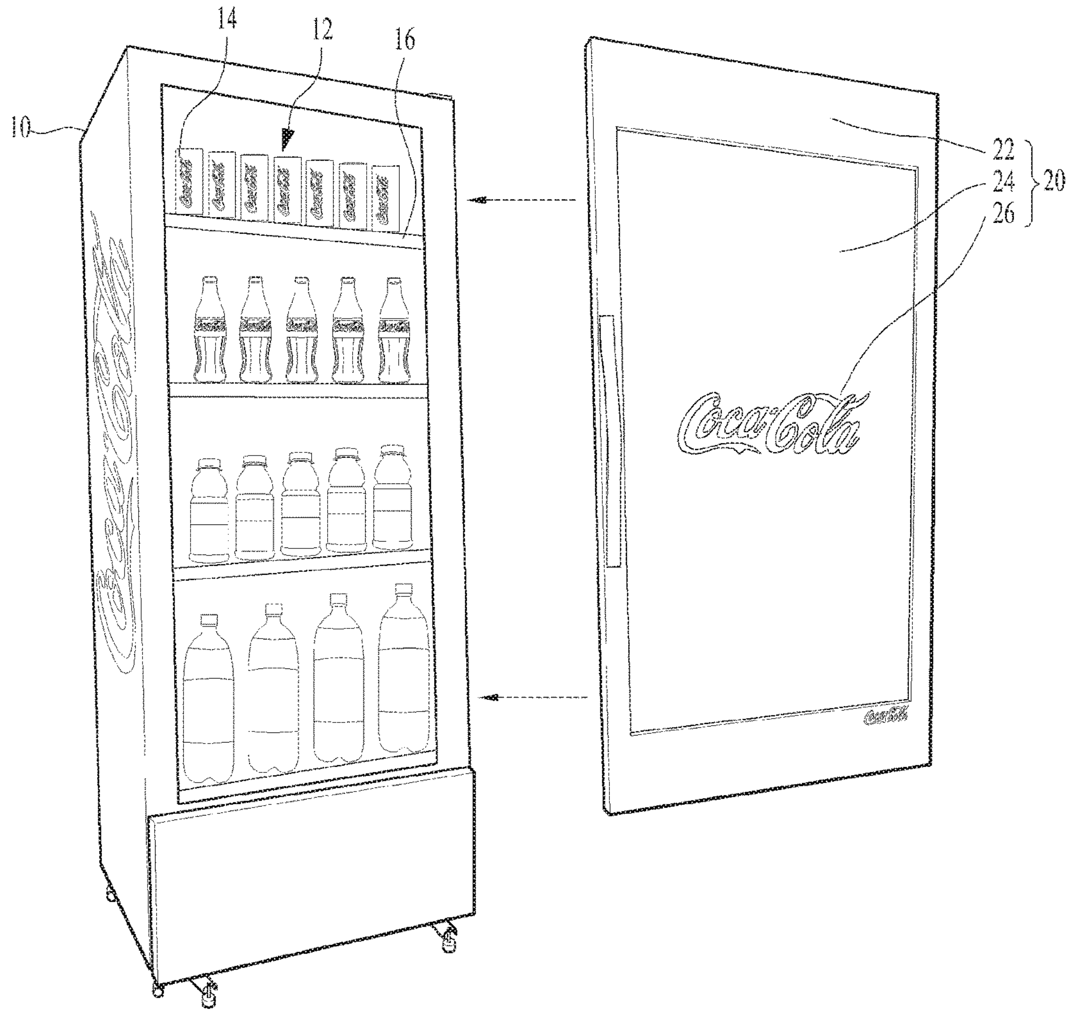
Figure 1C:
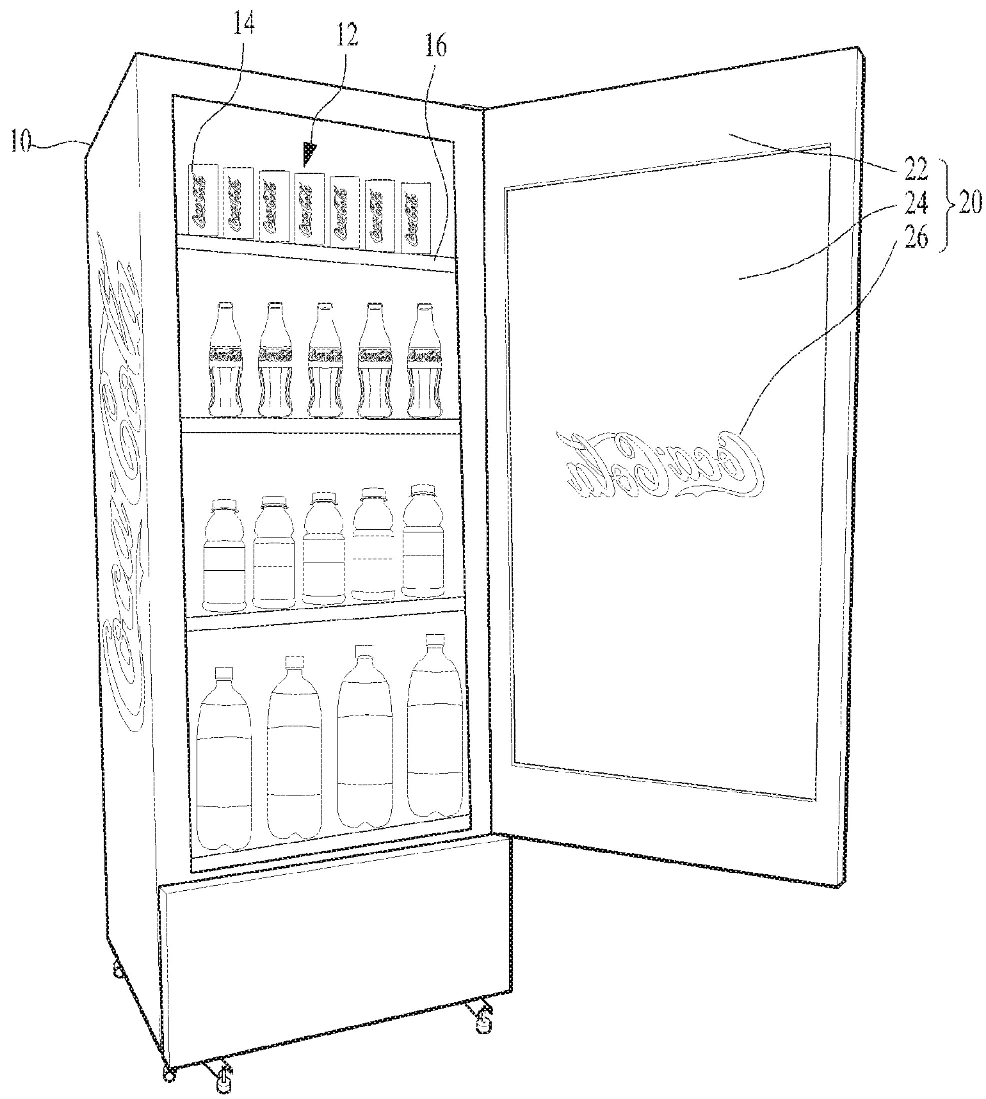

FIGS. 1*a* to 1*c* are views illustrating a predetermined product to which a transparent display device according to the present invention is provided. FIG. 1*a* illustrates a predetermined product to which the transparent display device is provided on a front surface, FIG. 1*b* illustrates a predetermined product from which the transparent display device is detached, and FIG. 1*c* illustrates a predetermined product opened by rotatable movement of the transparent display device.

As shown in FIGS. 1*a* to 1*c*, the transparent display device 20 according to the present invention may be provided to a front surface portion of the predetermined product 10 to serve as a door unit of the predetermined product 10.

In this case, the predetermined product 10 may be a refrigerating storage device such as a cooler. The predetermined product 10 may be a storage device that may keep various articles or may be a digital signage without limitation to the refrigerating storage device.

The transparent display device 20 may include a transparent display panel 24 displaying a predetermined image 26 on a screen, and a frame 22 supporting the periphery of the transparent display panel 24.

Also, the transparent display device 20 may include a power supply for supplying a power source, wherein the power supply may be arranged in a cover unit 30 located at the lower end of the predetermined product 10.

In this case, the transparent display device 20 that includes the frame 22 and the transparent display panel 24 may be rotatably moved by a hinge fastened at one side of the product 10.

Therefore, the frame 22 and the transparent display panel 24 of the transparent display device 20 may rotatably be moved, and the power supply of the transparent display device 20 may be fixed without rotatable movement.

As the case may be, the power supply of the transparent display device 20 may rotatably be moved together with the frame 22 and the transparent display panel 24 depending on a place where the power supply is arranged.

For example, the transparent display device 20 may include a frame 22, which includes an opening, a transparent display panel 24 arranged at the opening, and a control module arranged at the frame zone, controlling the transparent display panel 24.

In this case, the transparent display panel 24 and the frame 22 where the control module is arranged are provided to cover the front surface of the predetermined product 10, whereby the door unit of the predetermined product 10 may be formed.

Also, the transparent display panel 24 and the frame 22 where the control module is arranged are may rotatably be moved when the inside of the predetermined product 10 is opened and closed.

In this case, various articles 14 may be displayed on a rack 16 at an inner space 12 of the product 10, and information related to the articles 14 kept in the product 10 may be displayed on the transparent display panel 24.

The transparent display panel 24 may include at least one of a liquid crystal display (LCD), a thin film transistor-liquid crystal display (TFT-LCD), an organic light-emitting diode (OLED), a flexible display and a 3D display, and may be configured in a transparent type or light-transmissive type to allow a user to view a rear side through the at least one included in the transparent display panel 24.

A main example of the transparent display panel 24 includes a transparent OLED (TOLED). The transparent display panel 24 may be configured in a rear structure or a light-transmissive structure, and in accordance with this structure, a user may view an object located at the rear of the transparent display device through a zone reserved by the transparent display panel 24.

The transparent display device may include two transparent display panels 24 in accordance with its embodiment type. For example, a plurality of transparent display panels 24 may be spaced apart from one another on one surface or may be arranged in a single body, or may be arranged on their respective surfaces different from one another.

Also, if the transparent display panel 24 and a touch sensor are formed in a mutual layer structure or formed in a single body, the transparent display panel 24 may be used as an input device in addition to an output device.

In this case, if the touch sensor is a type of a touch film, a touch sheet, a touch pad, etc., for example, the touch sensor may be deposited on the transparent display panel 24 form a layer structure. The touch sensor and the transparent display panel 24 may be formed in a single body in such a manner that the touch sensor is included in the transparent display panel 24.

Next, the frame 22 may include a front door frame and a rear door frame.

In this case, the front door frame may include a first opening, and the rear door frame may include a second opening. An area of the first opening may be different from that of the second opening.

For example, the area of the second opening of the rear door frame may be wider than that of the first opening of the front door frame.

This is because that an inner space is more required to provide a light source module at an inner side of the rear door frame.

If the area of the second opening of the rear door frame is narrower than that of the first opening of the front door frame, since the light source module provided at the inner side of the rear door frame may be exposed to the outside, it is preferable that the area of the second opening of the rear door frame is wider than that of the first opening of the front door frame.

Also, the front door frame may include an extension frame. The extension frame may be extended toward the rear door frame, and may be fastened into the rear door frame.

The extension frame may be provided with a line space through which a connection line passes.

In this case, the reason why the line space for passing through the connection line is formed in the extension frame is that the connection line electrically connects the transparent display panel 24 located above the control module with the control module located below the transparent display panel 24.

Subsequently, the rear door frame may be fastened into a buffer member arranged in a direction of the product 10.

This is because that a damage caused by impact between the frame 22 and the product 10 should be avoided.

For example, the rear door frame may be provided with at least one fastening hole in a direction of the product 10, and the buffer member may be provided with a fastening projection in a direction of the rear door frame.

In this case, the fastening projection of the buffer member may be fastened into the fastening hole of the rear door frame.

And, the rear door frame may include at least one light source module arranged at one side area facing the second opening.

In this case, the light source module may have a length longer than a side length of the transparent display panel 24.

This is because that light generated from the light source module determines luminance inside the transparent display panel 24 and the product 10.

If the length of the light source module is shorter than the side length of the transparent display panel, luminance inside the transparent display panel 24 and the product 10 may be deteriorated.

Therefore, problems may occur in that an image displayed on the transparent display panel 24 is not clear and the articles 14 displayed at the inner space of the product 10 may not be seen from the outside.

Also, the transparent display device 20 may further include a first transparent cover and a second transparent cover.

In this case, the first transparent cover may be arranged at a first interval from the front surface of the transparent display panel 24, and the second transparent cover may be arranged at a second interval from the rear surface of the transparent display panel 24.

For example, the first interval and the second interval may be different from each other, and the first interval may be wider than the second interval.

This is to protect the transparent display panel 24 from external impact.

If the first interval is narrower than the second interval, an interval between the first transparent cover arranged at the outmost and the transparent display panel 24 becomes narrow, whereby external impact may easily be transferred to the transparent display panel 24. For this reason, the transparent display panel 24 may be damaged by external impact.

Also, a first air gap may be formed between the first transparent cover and the front surface of the transparent display panel 24 by the first interval, and a second air gap may be formed between the second transparent cover and the rear surface of the transparent display panel 24 by the second interval.

This is because that moisture is generated by a temperature difference between the transparent display panel 24 and the first and second transparent covers and may adversely affect the transparent display panel 24 to deteriorate lifespan of the transparent display panel 24.

As the case may be, a blower may be arranged at the frame 22 to emit heat generated from the control module toward the rear surface of the transparent display panel 24.

In this case, the blower may flow the air having heat toward the rear surface of the transparent display panel 24 in accordance with a control signal of the control module, whereby moisture in the air gap may be removed.

For example, a humidity sensor for sensing humidity in the air gap may be arranged at the frame 22. The control module may control the blower by receiving a sensing signal of the humidity sensor.

That is, the control module may control the blower to turn on the blower if humidity in the air gap is high and to turn off the blower if humidity in the air gap is low.

Therefore, according to the present invention, the transparent display panel may be prevented from being affected adversely by humidity, whereby lifespan of the transparent display panel may be increased.

The first transparent cover may be made of a material different from that of the second transparent cover.

In this case, the first transparent cover may be made of a front tempered glass material, and the second transparent cover may be made of a rear insulating material.

This is because that the first transparent cover located at the outmost should be protected from external impact and the second transparent cover should prevent external heat from being permeated into the product 10 such as a cooler.

As the case may be, the first transparent cover and the second transparent cover may be made of various materials depending on their functions.

An anti-reflection (AR) coating film may be formed on a front surface of the transparent cover.

This is because that luminance and contrast of an image displayed on the transparent display panel 24 may be deteriorated if external light is reflected toward the transparent cover.

Also, corner areas of the first and second transparent covers may adhere to the frame 22.

Subsequently, a first spacer and a second spacer may be arranged at the corner areas of the first and second transparent covers.

In this case, the first spacer may control an interval between the first and second transparent covers and an interval between the first transparent cover and the transparent display panel 24.

And, the second spacer may control an interval between the second transparent cover and the transparent display panel 24.

For example, the first spacer may include first and second support bars and first and second connection bars.

In this case, the first support bar may control the interval between the first and second transparent covers, and the second support bar may control the interval between the first transparent cover and the transparent display panel 24.

The first connection bar may connect one side end of the first support bar with one side end of the second support bar and may be in contact with the corner area of the first transparent cover, and the second connection bar may be connected to the other side end of the first support bar and may be in contact with the corner area of the second transparent cover.

Also, the control module is arranged in the area of the frame 22 located outside the first and second transparent covers, and may be provided with a conformal coating film formed on its external surface.

If the control module is arranged in the area of the frame 22 located outside the first and second transparent covers, circuit parts included in the control module may easily be repaired and exchanged with other ones. If the conformal coating film is formed on the external surface, the control module may be prevented from being damaged by temperature and humidity in a refrigerating environment.

For example, the control module may include a first interface unit for receiving a signal from an external device, a second interface unit for receiving a signal from a remote controller, and a controller for controlling the transparent display panel 24 in accordance with the signals received from the first and second interface units.

In this case, the first interface unit may connect the external device with the transparent display device 20.

In this case, the first interface unit may be connected to the external device such as Digital Versatile Disk (DVD), Blu-ray, game device, camera, camcorder, computer (e.g., notebook computer), etc. through wire/wireless cables.

The first interface unit may forward video, audio, or data signal, which is externally input through the external device connected thereto, to the control module of the transparent display device 20. Also, the first interface unit may output the video, audio or data signal processed by the control module to the external device.

To this end, the first interface unit may include an A/V input/output unit (not shown) or a wireless communication unit (not shown).

The A/V input/output unit may include a USB terminal, a composite Video Banking Sync (CVBS) terminal, a component terminal, an S-video terminal (analog), a Digital Visual Interface (DVI) terminal, a High Definition Multimedia Interface (HDMI) terminal, an RGB terminal, a D-SUB terminal, etc., to input the video and audio signals of the external device to the transparent display device 20.

The wireless communication unit may perform short range wireless communication with other electronic devices.

Subsequently, the transparent display device 20 may be connected with the other electronic devices through the network in accordance with the communication standards such as Bluetooth, Radio Frequency Identification (RFID), infrared Data Association (IrDA), Ultra Wideband (UWB), ZigBee, Digital Living Network Alliance (DLNA), etc.

Also, the second interface unit may forward a signal input by a user to the control module, or may forward the signal from the control module to the user.

For example, the second interface unit may receive a control signal such as power on/off and screen setup from a remote controller and gesture and audio information input through the remote controller in accordance with various communication modes such as RF (Radio Frequency) communication mode and IR communication mode, or may transmit the control signal from the control module to the remote controller.

Also, for example, the second interface unit may forward a control signal input by a local key (not shown) such as a power key, a volume key, and a setup key to the control module.

The remote controller is intended to transmit a user input to the second interface unit, and may use Bluetooth, RF (Radio Frequency) communication, Infrared Ray (IR) communication, UWB (Ultra WideBand), ZigBee mode, etc.

Also, the remote controller may receive the video, audio or data signal output from the second interface unit and display the received signal therethrough or output audio or vibration.

As the case may be, the control module may further include a third interface unit for connection with the wire/wireless network.

In this case, the third interface unit may be connected to various set-top boxes through at least one of the above-mentioned various terminals to perform input/output operation with the set-top boxes.

The third interface unit may provide an interface for connecting the transparent display device 20 with wire/wireless networks including Internet network. The third interface unit may include an Ethernet terminal, for example, for wire network connection. For example, communication standards such as Wireless LAN (WLAN) (Wi-Fi), Wireless broadband (Wibro), World Interoperability for Microwave Access (Wimax), and High Speed Downlink Packet Access (HSDPA) may be used for the wireless network connection.

Subsequently, the third interface unit may transmit or receive data to or from another user or another electronic device through the connected network or another network linked to the connected network.

As another case, the control module may further include an audio output unit for outputting the audio signal processed from the controller.

In this case, the audio output unit may receive a signal audio-processed by the control module, for example, a stereo signal, a 3.1 channel signal or a 5.1 channel signal, and outputs the received signal as audio. The audio output unit may be configured as one of various types of speakers.

Also, the control module may control luminance of the transparent display panel 24 when the frame 22 is rotatably moved to open the predetermined product 10.

The control module may control the transparent display panel 24 to display information related to the articles 14 kept in the predetermined product 10.

Subsequently, the control module may control the transparent display panel 24 to simultaneously display a transmissive area where light is transmitted and a non-transmissive area where light is not transmitted.

In this case, the control module may control the transparent display panel 24 to display the information related to the articles 14 kept in the predetermined product 10 on the non-transmissive area.

As the case may be, the control module may control the transparent display panel 24 to display the information related to the articles 14 seen through the transmissive area among the articles 14 kept in the predetermined product 10, on the non-transmissive area.

The transparent display device 20 may further include cover unit 30 that includes a power supply for supplying a power source to the transparent display panel 24 and the control module.

In this case, the cover unit 30 may be arranged to be spaced apart from the frame 22 at a predetermined interval and may be fixed to the lower end of the predetermined product 10.

Also, the cover unit 30 may be fixed to the lower end of the predetermined product 10 when the frame 22 is rotatably moved to open and close the predetermined product 10.

As the case may be, the cover unit 30 may further include an audio output unit for outputting the audio signal processed from the control module.

As described above, according to the present invention, the frame in which the transparent display panel and the control module are arranged is provided to cover the front surface of the predetermined product and rotatably moved when the inside of the product is opened and closed, whereby the frame may serve as a door unit and at the same time perform various functions such as article information in the product and advertisement.

Also, according to the present invention, the control module and the light source module are arranged outside the transparent cover unit, whereby circuit parts may easily be repaired and exchanged with other ones, and mass production may be performed.

Also, according to the present invention, the transparent display panel from which a polarizer and a light guide plate are removed may be used, whereby installation of the transparent display panel is simple due to its light weight, and the production cost may be reduced.

Also, according to the present invention, as the interface unit connected to the external device and the remote controller may be arranged, various contents received from the external device may be displayed, and luminance may be controlled in accordance with the control signal received from the remote controller, whereby user convenience is excellent.

And, according to the present invention, as the audio output unit may be arranged, sound of a contents image displayed on the transparent display panel may be provided, whereby it is easy to advertise and promote the articles.

As described above, according to the present invention, the articles, such as beverages, in the product may be displayed together with advertisement contents to attract consumers' attention and improve a purchase desire of the consumers.

Figure 2:
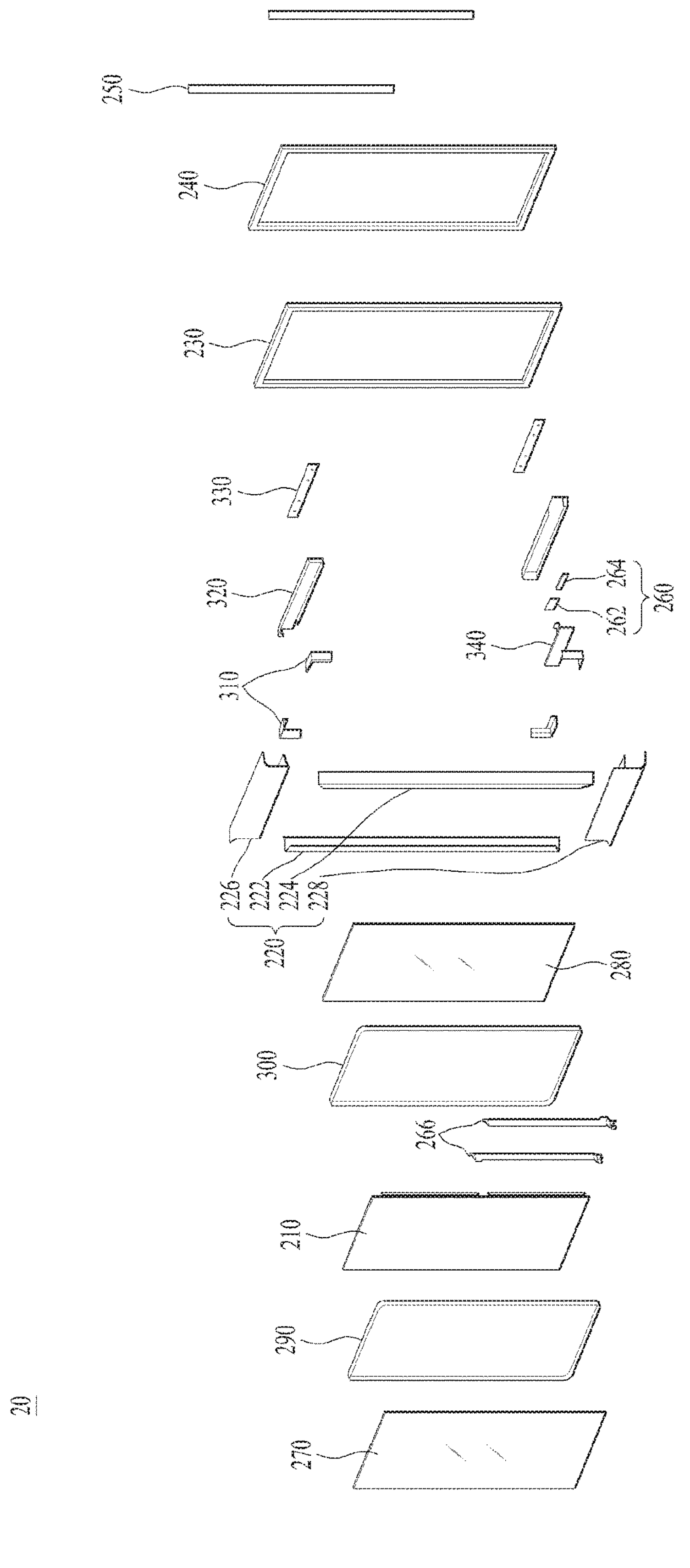
FIG. 2 is an exploded view illustrating a transparent display device according to the present invention.
Figure 3:
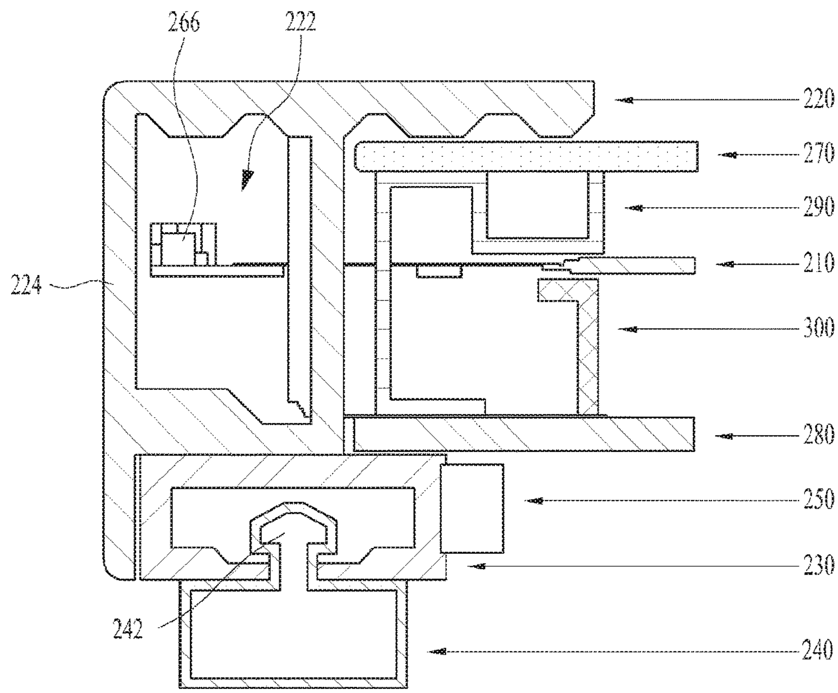
FIG. 3 is a cross-sectional view of FIG. 2.

FIG. 2 is an exploded view illustrating a transparent display device according to the present invention, and FIG. 3 is a cross-sectional view of FIG. 2.

As shown in FIGS. 2 and 3, the transparent display device 20 may include a frame, a transparent display panel 210, and a control module 260.

In this case, the frame may include an opening, and the transparent display panel 210 may be arranged at the opening of the frame.

The control module 260 may be arranged at the frame area located outside the transparent display panel 210 to control the transparent display panel 210.

Also, the frame in which the transparent display panel 210 and the control module 260 are arranged may be provided to cover the front surface of the predetermined product to form a door unit of the predetermined product, and may rotatably be moved when the inside of the predetermined product is opened and closed.

Subsequently, the frame may include a front door frame 220 and a rear door frame 230.

In this case, the front door frame 220 may form a rectangular frame by combining a left frame 222, a right frame 224, an upper frame 226 and a lower frame 229 with one another, and may form a first opening at the center.

The rear door frame 230 may form a second opening at the center, and may be connected to the front door frame 220.

At this time, an area of the first opening may be different from that of the second opening.

For example, the area of the second opening of the rear door frame 230 may be wider than that of the first opening of the front door frame 220.

This is because that an inner space is more required to provide a light source module 250 at an inner side of the rear door frame 230.

If the area of the second opening of the rear door frame 230 is narrower than that of the first opening of the front door frame 220, since the light source module 250 provided at the inner side of the rear door frame 230 may be exposed to the outside, it is preferable that the area of the second opening of the rear door frame 230 is wider than that of the first opening of the front door frame 220.

Also, the front door frame 220 may include an extension frame 224. The extension frame 224 may be extended toward the rear door frame 230, and may be fastened into the rear door frame 230.

The extension frame 224 may be provided with a line space 222 through which a connection line 266 passes.

In this case, the reason why the line space 222 for passing through the connection line 226 is formed in the extension frame 224 is that the connection line 226 electrically connects the transparent display panel 210 located above the control module 260 with the control module 260 located below the transparent display panel 210.

Subsequently, the rear door frame 230 may be fastened into a buffer member 240 at the rear where the predetermined product is arranged.

This is because that a damage caused by impact between the rear door frame 230 and the predetermined product should be avoided.

For example, the rear door frame 230 may be provided with at least one fastening hole at the rear, and the buffer member 240 may be provided with a fastening projection 242 in a direction of the rear door frame 230.

In this case, the fastening projection 242 of the buffer member 240 may be fastened into the fastening hole of the rear door frame 230.

And, the rear door frame 230 may include at least one light source module 250 arranged at one side area facing the second opening.

Subsequently, a hinge 310, a frame board 340, a cover board 320 that covers the control module 260, which includes a main board 262 and a t-con 264, and a door back frame 330 may additionally be arranged between the front door frame 220 and the rear door frame 230.

In this case, the hinge 310 may be arranged at a corner area of the front door frame 220, and the frame board 340 and the control module 260 may be arranged to correspond to a lower frame 228 of the front door frame 220.

The cover board 320 and the door back frame 330 may be arranged to respectively correspond to the upper frame 226 and the lower frame 228 of the front door frame 220.

Also, the first transparent cover 270 may be arranged at a first interval from the front surface of the transparent display panel 210, and the second transparent cover 280 may be arranged at a second interval from the rear surface of the transparent display panel 210.

For example, the first interval and the second interval may be different from each other, and the first interval may be wider than the second interval.

This is to protect the transparent display panel 210 from external impact.

If the first interval is narrower than the second interval, an interval between the first transparent cover 270 arranged at the outmost and the transparent display panel 210 becomes narrow, whereby external impact may easily be transferred to the transparent display panel 210. For this reason, the transparent display panel 210 may be damaged by external impact.

Also, a first air gap may be formed between the first transparent cover 270 and the front surface of the transparent display panel 210 by the first interval, and a second air gap may be formed between the second transparent cover 280 and the rear surface of the transparent display panel 210 by the second interval.

This is because that moisture is generated by a temperature difference between the transparent display panel 210 and the first and second transparent covers 270 and 280 and may adversely affect the transparent display panel 210 to deteriorate lifespan of the transparent display panel 210.

The first transparent cover 270 may be made of a material different from that of the second transparent cover 280.

In this case, the first transparent cover 270 may be made of a front tempered glass material, and the second transparent cover 280 may be made of a rear insulating material.

This is because that the first transparent cover 270 located at the outmost should be protected from external impact and the second transparent cover 280 should prevent external heat from being permeated into the product such as a cooler.

As the case may be, the first transparent cover 270 and the second transparent cover 280 may be made of various materials depending on their functions.

An anti-reflection (AR) coating film may be formed on a front surface of the first transparent cover 270.

This is because that luminance and contrast of an image displayed on the transparent display panel 210 may be deteriorated if external light is reflected toward the transparent cover.

Also, corner areas of the first and second transparent covers 270 and 280 may adhere to the front door frame 220 and the rear door frame 230.

Subsequently, a first spacer 290 and a second spacer 300 may be arranged at the corner areas of the first and second transparent covers 270 and 280.

In this case, the first spacer 290 may control an interval between the first and second transparent covers 270 and 280 and an interval between the first transparent cover 270 and the transparent display panel 210.

And, the second spacer 300 may control an interval between the second transparent cover 280 and the transparent display panel 210.

Figure 4:
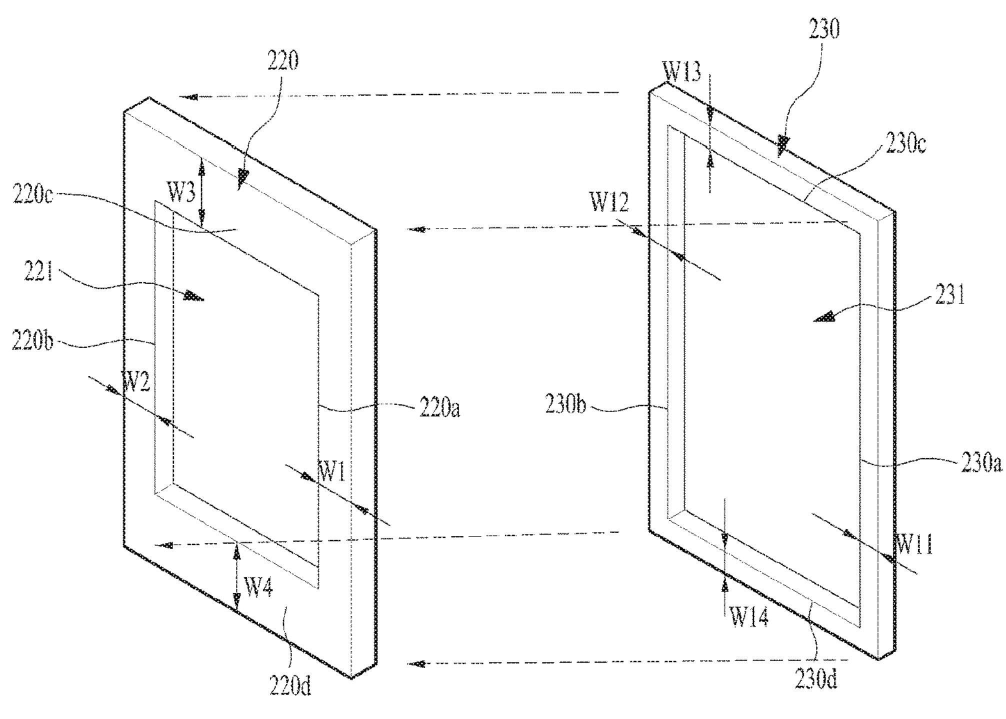
FIG. 4 is a view illustrating a front door frame and a rear door frame of FIG. 2.

FIG. 4 is a view illustrating a front door frame and a rear door frame of FIG. 2.

As shown in FIG. 4, the front door frame 220 may form a rectangular frame, and may form a first opening 221 at the center.

The rear door frame 230 may form a second opening 231 at the center, and may be connected to the front door frame 220.

At this time, an area of the first opening 221 may be different from that of the second opening 231. The area of the second opening 231 of the rear door frame 230 may be wider than that of the first opening 221 of the front door frame 220.

This is because that an inner space is more required to provide a light source module at an inner side of the rear door frame 230.

If the area of the second opening 231 of the rear door frame 230 is narrower than that of the first opening 221 of the front door frame 220, since the light source module provided at the inner side of the rear door frame 230 may be exposed to the outside, it is preferable that the area of the second opening 231 of the rear door frame 230 is wider than that of the first opening 221 of the front door frame 220.

Widths w1 and w2 of left and right frame bars 220*a* and 220*b* of the front door frame 220 are the same as each other, and widths w3 and w4 of upper and lower frame bars 220*c* and 220*d* of the front door frame 220 are the same as each other.

The widths w3 and w4 of the upper and lower frame bars 220*c* and 220*d* of the front door frame 220 may be wider than the widths w1 and w2 of the left and right frame bars 220*a* and 220*b* of the front door frame 220.

This is because that circuit boards such as a control module may be provided at the area of the upper and lower frame bars 220*c* and 220*d* of the front door frame 220.

Various lines connected to the control module may be arranged at the areas of the left and right frame bars 230*a* and 230*b* of the rear door frame 230.

Also, widths w11 and w12 of left and right frame bars 230*a* and 230*b* of the rear door frame 230 are the same as each other, and widths w13 and w14 of upper and lower frame bars 230*c* and 230*d* of the rear door frame 230 are the same as each other.

The widths w11 and w12 of the left and right frame bars 230*a* and 230*b* of the rear door frame 230 may be the same as the widths w13 and w14 of the upper and lower frame bars 230*c* and 230*d*.

Figure 5:
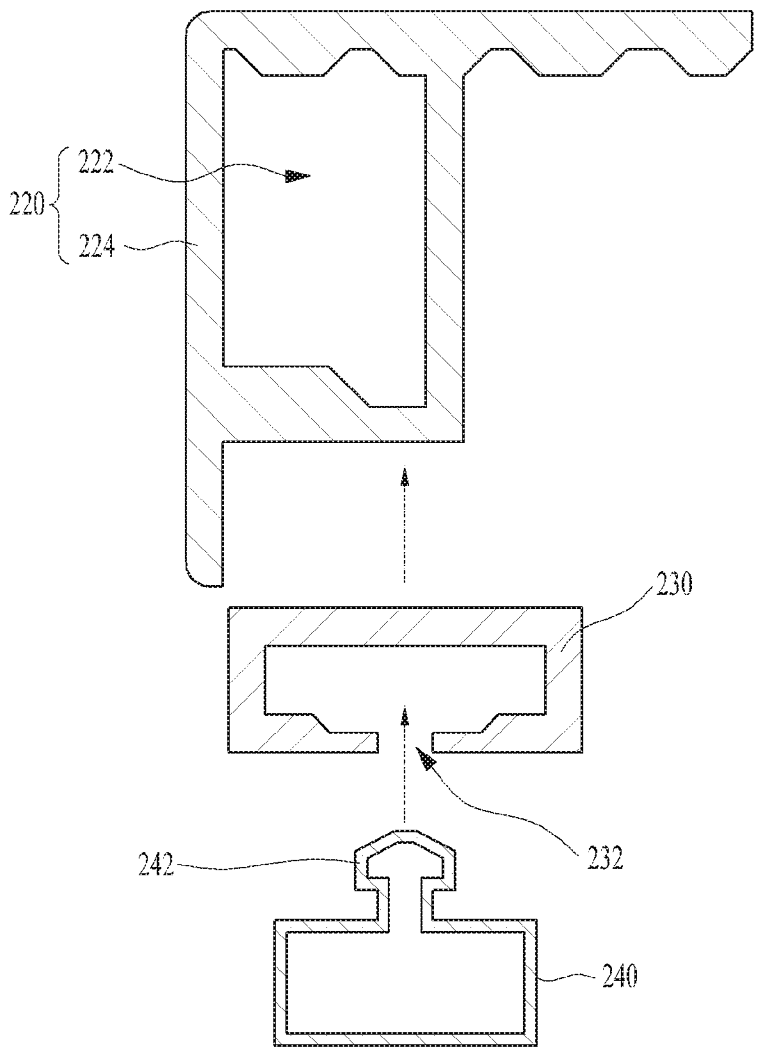
FIG. 5 is a view illustrating a fastening process of a front door frame, a rear door frame and a buffer member of FIG. 2.

FIG. 5 is a view illustrating a fastening process of a front door frame, a rear door frame and a buffer member of FIG. 2.

As shown in FIG. 5, the rear door frame 230 may be fastened into the rear of the front door frame 220, and the buffer member 240 may be fastened into the rear of the rear door frame 230.

In this case, the front door frame 220 may include an extension frame 224. The extension frame 224 may be extended toward the rear door frame 230, and may be fastened into the rear door frame 230.

At this time, the extension frame 224 may be fastened into the rear door frame 230 by an adhesive or a fastening screw.

The extension frame 224 may be provided with a line space 222 through which a connection line 266 passes.

Subsequently, the rear door frame 230 may be fastened into a buffer member 240.

This is because that a damage caused by impact between the rear door frame 230 and the predetermined product should be avoided.

In this case, the rear door frame 230 may be provided with at least one fastening hole 232 at the rear, and the buffer member 240 may be provided with a fastening projection 242 in a direction of the rear door frame 230.

In this case, the fastening projection 242 of the buffer member 240 may be fastened into the fastening hole 232 of the rear door frame 230.

Figure 6:
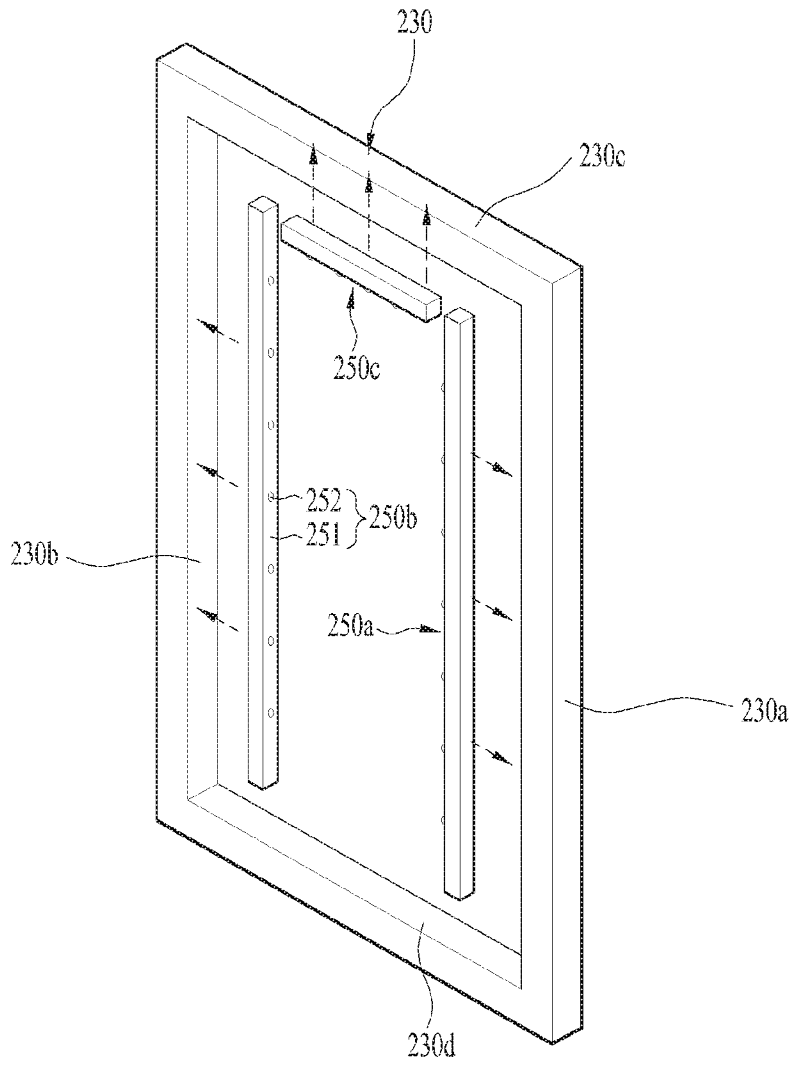
FIG. 6 is a view illustrating a process of arranging a light source module of FIG. 2.

FIG. 6 is a view illustrating a process of arranging a light source module of FIG. 2.

As shown in FIG. 6, the light source module 250 may be arranged at an inner side of the rear door frame 230.

In this case, the light source module 250 may include a substrate 251 having an electrode pattern, and at least one light source 252 arranged on the substrate 251.

At this time, a light source 252 of the light source module 250 may be a top view type light emitting diode.

As the case may be, the light source 252 may be a side view type light emitting diode.

The substrate 251 may be a printed circuit board (PCB) made of any one material selected from PET, glass, PC, and Si, or may be formed of a film type.

Also, a single layered PCB, a multi-layered PCB, a ceramic substrate, a metal core PCB, etc. may selectively be used as the substrate 251.

In this case, any one of a reflective coating film and a reflective coating material layer may be formed on the substrate 251, and the substrate 251 may transmit light generated from the light source 252 to the transparent display panel.

Subsequently, the light source 252 may be a light emitting diode (LED) chip which may be configured a blue LED chip or an ultraviolet LED chip, or may be configured as a package type obtained by combination of at least one or more of a red LED chip, a green LED chip, a blue LED chip, a yellow green LED chip and a white LED chip.

The white LED may be realized by combining a yellow phosphor on the blue LED, may be realized by using a red phosphor and a green phosphor on the blue LED, or may be realized using simultaneously a yellow phosphor, a red phosphor and a green phosphor on the blue LED.

Also, the light source module 250 may be fixed to all of the left and right frame bars 230*a* and 230*b* of the rear door frame 230 and the upper and lower frame bars 230*c* and 230*d* of the rear door frame 230, or may be fixed to some of them as the case may be.

For example, the light source module 250 may be at least any one of first, second and third light source modules 250*a*, 250*b* and 250*c*.

In this case, the first light source module 250*a* may be arranged at the inner side of the left frame bar 230*a* of the rear door frame 230, and the second light source module 250*b* may be arranged at the inner side of the right frame bar 230*b* of the rear door frame 230.

At this time, the first light source module 250*a* arranged at the left frame bar 230*a* of the rear door frame 230 and the second light source module 250*b* arranged at the right frame bar 230*b* of the rear door frame 230 may face each other.

The third light source module 250*c* may be arranged at the inner side of the upper frame bar 230*c* of the rear door frame 230.

At this time, the third light source module 250*c* may be arranged at the inner side of the upper frame bar 230*c* of the rear door frame 230 may face the lower frame bar 230*d* of the rear door frame 230.

Also, the light sources 252 of the light source module 250 may be driven simultaneously as one substrate 251 is arranged along the side of the rear door frame 230.

As the case may be, as a plurality of substrates 251 are arranged along the side of the rear door frame 230, the light sources 252 of the light source module 250, which are arranged on each substrate 251, may be driven individually.

Figure 7:
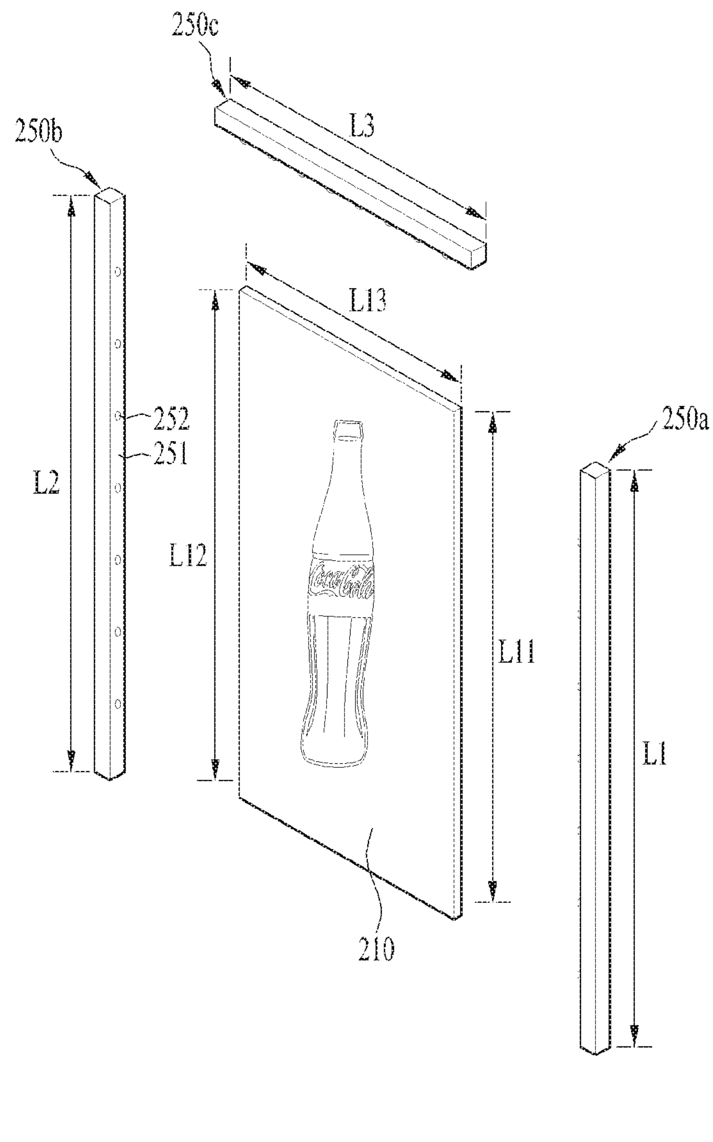
FIG. 7 is a view illustrating a length of a light source module of FIG. 2.

FIG. 7 is a view illustrating a length of a light source module of FIG. 2.

As shown in FIG. 7, the light source module 250 may be arranged along the outline of the transparent display panel 210 by being supported by the inner side of the rear door frame.

In this case, the light source module 250 may include a substrate 251 having an electrode pattern, and at least one light source 252 arranged on the substrate 251.

In this case, the light source module 250 may have a length longer than a side length of the transparent display panel 210.

This is because that light generated from the light source module 250 determines luminance of the transparent display panel 24 and the inner space of the product.

If the length of the light source module 250 is shorter than the side length of the transparent display panel 210, luminance of the transparent display panel 24 and the inner space of the product may be deteriorated.

Therefore, problems may occur in that an image displayed on the transparent display panel 210 is not clear and the articles displayed at the inner space of the product may not be seen from the outside.

For example, the light source module 250 may be at least any one of first, second and third light source modules 250*a*, 250*b* and 250*c*.

In this case, the first light source module 250*a* may be arranged around at the left side of the transparent display panel 210, and the second light source module 250*b* may be arranged around at the right side of the transparent display panel 210.

The third light source module 250*c* may be arranged around at the upper side of the transparent display panel 210.

In this case, a length L1 of the first light source module 250*a* may be longer than a left length L11 of the transparent display panel 210, and a length L2 of the second light source module 250*b* may be longer than a right length L12 of the transparent display panel 210.

Subsequently, a length L3 of the third light source module 250*c* may be longer than an upper length L13 of the transparent display panel 210.

Also, the length L1 of the first light source module 250*a* may be the same as the length L2 of the second light source module 250*b*.

And, the length L3 of the third light source module 250*c* may be shorter than the length L1 of the first light source module 250*a* and the length L2 of the second light source module 250*b*.

Figure 8:
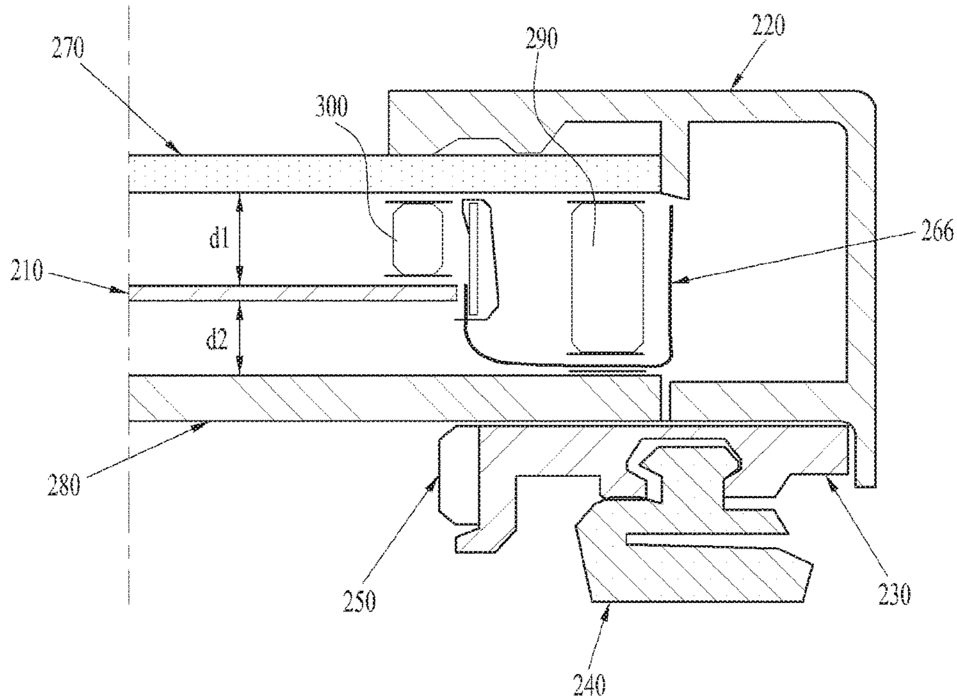
FIG. 8 is a view illustrating arrangement of first and second transparent covers of FIG. 2.

FIG. 8 is a view illustrating arrangement of first and second transparent covers of FIG. 2.

As shown in FIG. 8, the transparent display device may further include a first transparent cover 270 and a second transparent cover 280.

In this case, the first transparent cover 270 may be arranged at a first interval d1 from the front surface of the transparent display panel 210, and the second transparent cover 280 may be arranged at a second interval d2 from the rear surface of the transparent display panel 210.

For example, the first interval d1 and the second interval d2 may be different from each other, and the first interval d1 may be wider than the second interval d2.

This is to protect the transparent display panel 210 from external impact.

If the first interval d1 is narrower than the second interval d2, an interval between the first transparent cover 270 arranged at the outmost and the transparent display panel 210 becomes narrow, whereby external impact may easily be transferred to the transparent display panel 210. For this reason, the transparent display panel 210 may be damaged by external impact.

Also, a first air gap may be formed between the first transparent cover 270 and the front surface of the transparent display panel 210 by the first interval d1, and a second air gap may be formed between the second transparent cover 280 and the rear surface of the transparent display panel 210 by the second interval d2.

This is because that moisture is generated by a temperature difference between the transparent display panel 210 and the first and second transparent covers 270 and 280 and may adversely affect the transparent display panel 210 to deteriorate lifespan of the transparent display panel 210.

The first transparent cover 270 may be made of a material different from that of the second transparent cover 280.

In this case, the first transparent cover 270 may be made of a front tempered glass material, and the second transparent cover 280 may be made of a rear insulating material.

This is because that the first transparent cover 270 located at the outmost should be protected from external impact and the second transparent cover 280 should prevent external heat from being permeated into the product such as a cooler.

As the case may be, the first transparent cover 270 and the second transparent cover 280 may be made of various materials depending on their functions.

An anti-reflection (AR) coating film may be formed on a front surface of the first transparent cover 270.

This is because that luminance and contrast of an image displayed on the transparent display panel 210 may be deteriorated if external light is reflected toward the first transparent cover 270.

Subsequently, a first spacer 290 may control an interval between the first and second transparent covers 270 and 280, and a second spacer 300 may control an interval between the second transparent cover 280 and the transparent display panel 210.

Next, a corner area of the first transparent cover 270 may be in contact with the front door frame 220, and a corner area of the second transparent cover 280 may be in contact with the rear door frame 230.

The light source module 250 may be arranged at the rear corner area of the second transparent cover 280 by being supported by the rear door frame 230.

Additionally, a buffer member 240 may be arranged on the rear surface of the rear door frame 230, and a line 266 for electrically connecting the control module with the transparent display panel 210 may be arranged at a line space of the front door frame 220.

Figure 9:
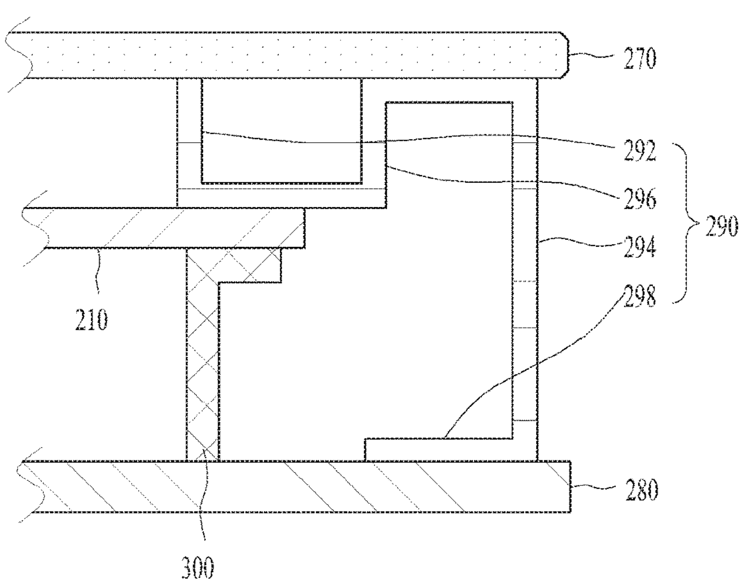
FIG. 9 is a view illustrating first and second spacers of FIG. 2.

FIG. 9 is a view illustrating first and second spacers of FIG. 2.

As shown in FIG. 9, the first spacer 290 and the second spacer 300 may be arranged at the corner areas of the first and second transparent covers 270 and 280.

In this case, the first spacer 290 may control the interval between the first and second transparent covers 270 and 280 and the interval between the first transparent cover 270 and the transparent display panel 210.

And, the second spacer 300 may control the interval between the second transparent cover 280 and the transparent display panel 210.

For example, the first spacer 290 may include first and second support bars 294 and 292 and first and second connection bars 296 and 298.

In this case, the first support bar 294 may control the interval between the first and second transparent covers 270 and 280, and the second support bar 292 may control the interval between the first transparent cover 270 and the transparent display panel 210.

The first connection bar 296 may connect one side end of the first support bar 294 with one side end of the second support bar 292 and may be in contact with the corner area of the first transparent cover 170, and the second connection bar 298 may be connected to the other side end of the first support bar 294 and may be in contact with the corner area of the second transparent cover 280.

Therefore, according to the present invention, since the air gap between the first and second transparent covers 270 and 280 and the transparent display panel 210 may be maintained stably by the first and second spacers 290 and 300, humidity due to a temperature difference may be minimized.

Figure 10:
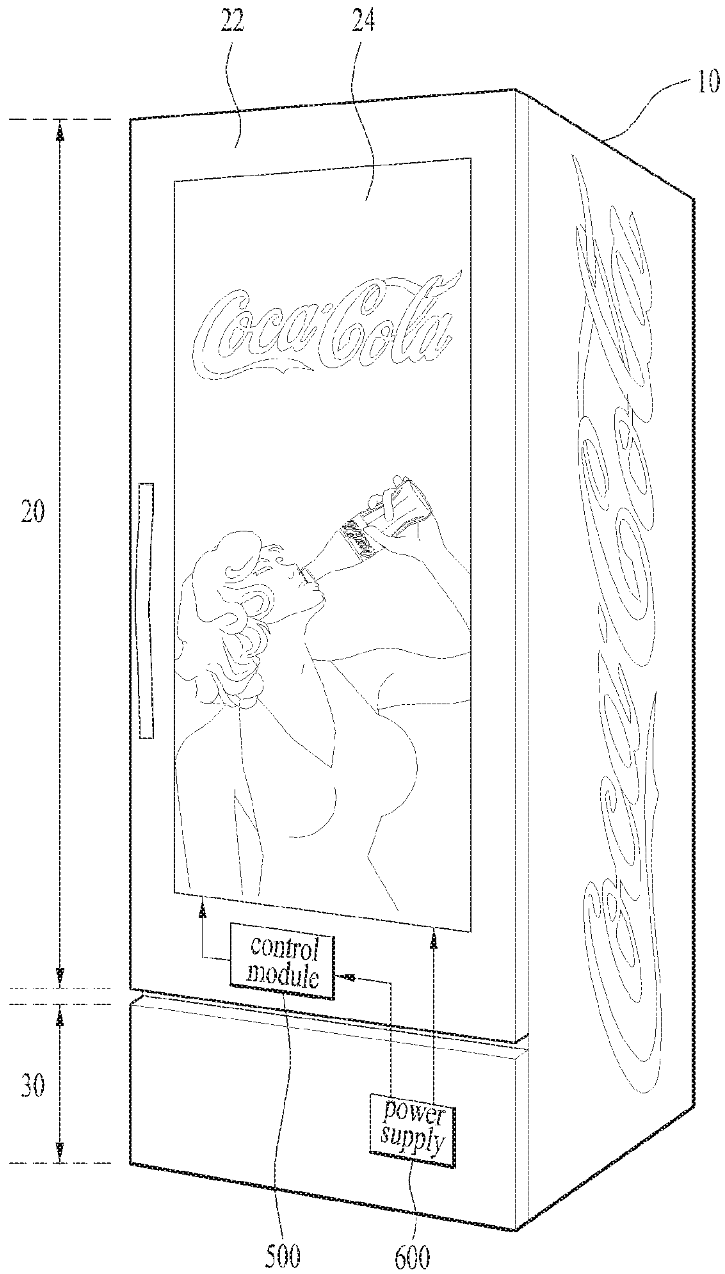
FIG. 10 is a view illustrating arrangement of a control module of FIG. 2.
Figure 11:
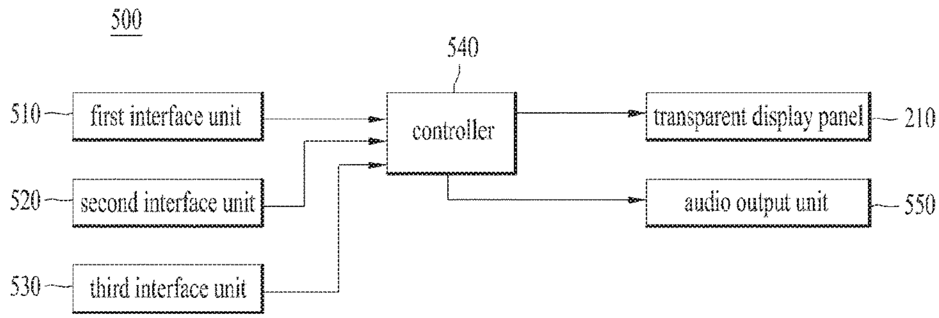
FIG. 11 is a block schematic view illustrating a control module of FIG. 2.

FIG. 10 is a view illustrating arrangement of a control module of FIG. 2, and FIG. 11 is a block schematic view illustrating a control module of FIG. 2.

As shown in FIGS. 10 and 11, the transparent display device 20 may be provided to a front surface portion of a predetermined product 10 such as a cooler to serve as a door unit of the predetermined product 10.

In this case, the predetermined product 10 may be a refrigerating storage device such as a cooler. The predetermined product 10 may be a storage device that may keep various articles or may be a digital signage without limitation to the refrigerating storage device.

The transparent display device 20 may include a transparent display panel 24 displaying a predetermined image 26 on a screen, and a frame 22 supporting the periphery of the transparent display panel 24.

Also, the transparent display device 20 may include a power supply for supplying a power source, wherein the power supply 600 may be arranged in a cover unit 30 located at the lower end of the predetermined product 10.

In this case, the transparent display device 20 that includes the frame 22 and the transparent display panel 24 may be rotatably moved by a hinge fastened at one side of the product 10.

Therefore, the frame 22 and the transparent display panel 24 of the transparent display device 20 may rotatably be moved by the hinge, and the power supply 600 of the transparent display device 20 may be fixed without rotatable movement.

As the case may be, the power supply 600 of the transparent display device 20 may rotatably be moved together with the frame 22 and the transparent display panel 24 depending on a place where the power supply 600 is arranged.

Also, the control module 500 may be provided with a conformal coating film formed on its external surface.

If the control module 500 is arranged in the area of the frame 22 located outside the transparent display panel 24, circuit parts included in the control module 500 may easily be repaired and exchanged with other ones. If the conformal coating film is formed on the external surface, the control module 500 may be prevented from being damaged by temperature and humidity in a refrigerating environment.

For example, as shown in FIG. 11, the control module 500 may include a first interface unit 510 for receiving a signal from an external device, a second interface unit 520 for receiving a signal from a remote controller, and a controller 540 for controlling the transparent display panel 24 in accordance with the signals received from the first and second interface units 510 and 520.

In this case, the first interface unit 510 may connect the external device with the transparent display device 20.

In this case, the first interface unit 510 may be connected to the external device such as Digital Versatile Disk (DVD), Blu-ray, game device, camera, camcorder, computer (e.g., notebook computer), etc. through wire/wireless cables.

The first interface unit 510 may forward video, audio, or data signal, which is externally input through the external device connected thereto, to the controller 540. Also, the first interface unit 510 may output the video, audio or data signal processed by the controller 540 to the external device.

To this end, the first interface unit 510 may include an A/V input/output unit (not shown) or a wireless communication unit (not shown).

The A/V input/output unit may include a USB terminal, a composite Video Banking Sync (CVBS) terminal, a component terminal, an S-video terminal (analog), a Digital Visual Interface (DVI) terminal, a High Definition Multimedia Interface (HDMI) terminal, an RGB terminal, a D-SUB terminal, etc., to input the video and audio signals of the external device to the transparent display device 20.

The wireless communication unit may perform short range wireless communication with other electronic devices.

Subsequently, the transparent display device 20 may be connected with the other electronic devices through the network in accordance with the communication standards such as Bluetooth, Radio Frequency Identification (RFID), infrared Data Association (IrDA), Ultra Wideband (UWB), ZigBee, Digital Living Network Alliance (DLNA), etc.

Also, the second interface unit 520 may forward a signal input by a user to the controller 540, or may forward the signal from the controller 540 to the user.

For example, the second interface unit 520 may receive a control signal such as power on/off and screen setup from a remote controller and gesture and audio information input through the remote controller in accordance with various communication modes such as RF (Radio Frequency) communication mode and IR communication mode, or may transmit the control signal from the control module to the remote controller.

Also, for example, the second interface unit 520 may forward a control signal input by a local key (not shown) such as a power key, a volume key, and a setup key to the controller 540.

The remote controller is intended to transmit a user input to the second interface unit 520, and may use Bluetooth, RF (Radio Frequency) communication, Infrared Ray (IR) communication, UWB (Ultra WideBand), ZigBee mode, etc.

Also, the remote controller may receive the video, audio or data signal output from the second interface unit 520 and display the received signal therethrough or output audio or vibration.

As the case may be, the control module 500 may further include a third interface unit 530 for connection with the wire/wireless network.

In this case, the third interface unit 530 may be connected to various set-top boxes through at least one of the above-mentioned various terminals to perform input/output operation with the set-top boxes.

The third interface unit 530 may provide an interface for connecting the transparent display device 20 with wire/wireless networks including Internet network. The third interface unit 530 may include an Ethernet terminal, for example, for wire network connection. For example, communication standards such as Wireless LAN (WLAN) (Wi-Fi), Wireless broadband (Wibro), World Interoperability for Microwave Access (Wimax), and High Speed Downlink Packet Access (HSDPA) may be used for the wireless network connection.

Subsequently, the third interface unit 530 may transmit or receive data to or from another user or another electronic device through the connected network or another network linked to the connected network.

As another case, the control module 500 may further include an audio output unit 550 for outputting the audio signal processed from the controller 540.

In this case, the audio output unit 550 may receive a signal audio-processed by the control module, for example, a stereo signal, a 3.1 channel signal or a 5.1 channel signal, and outputs the received signal as audio. The audio output unit 550 may be configured as one of various types of speakers.

As the case may be, the audio output unit 550 may be arranged in the cover unit 30 by being spaced apart from the control module 500.

Figure 12:
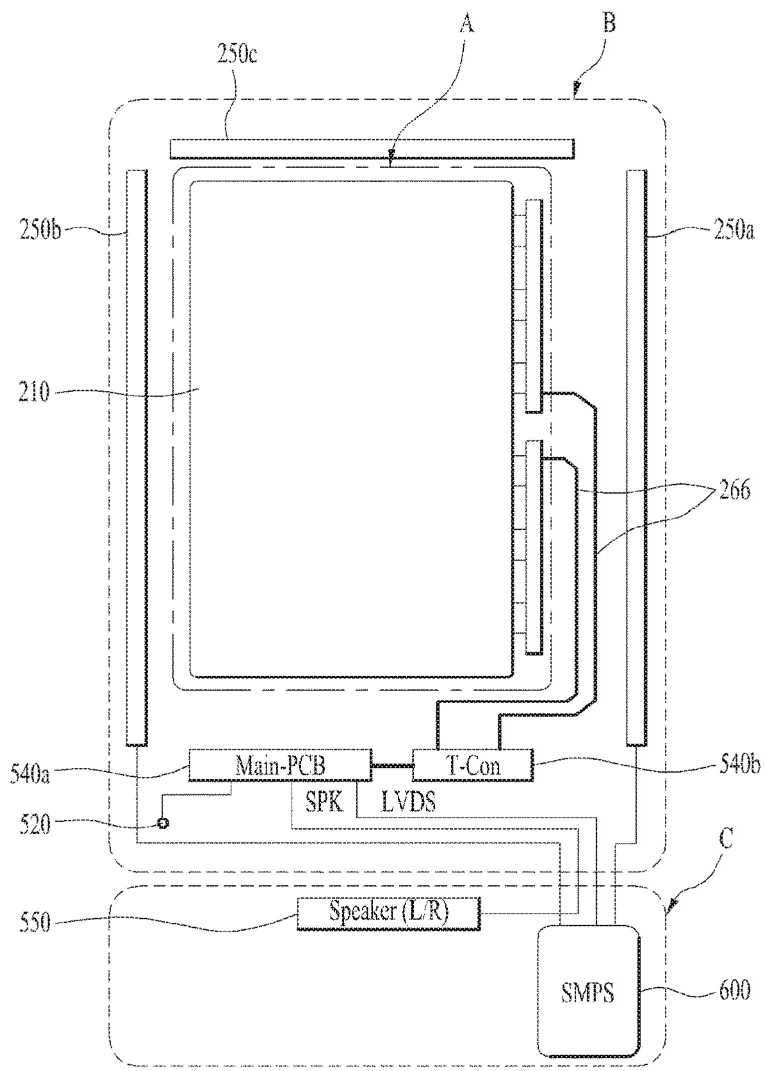
FIG. 12 is a view illustrating line connection of a control module of FIG. 2.

FIG. 12 is a view illustrating line connection of a control module of FIG. 2.

As shown in FIG. 12, the transparent display device may include an area A where the transparent display panel 210 is arranged, an area B where the frame is arranged, and an area C where the cover unit is arranged.

In this case, in the frame area B, the first light source module **250*a* may be arranged around the left side of the transparent display panel 210, the second light source module 250*b* may be arranged around the right side of the transparent display panel 210, and the third light source module 250*c* may be arranged around the upper side of the transparent display panel 210**.

The controller 540 that includes a main circuit **540*a* and a data processor 540*b* may be arranged around the lower side of the transparent display panel 210**.

In this case, the data processor **540*b* may electrically be connected with the transparent display panel 210 by the line 266**.

Also, the first interface unit for receiving a signal from an external device, the second interface unit 520 for receiving a signal from a remote controller, and the third interface unit for connection with the wire/wireless networks may be arranged around the controller 540.

Subsequently, in the area C of the cover unit, the power supply 600 for supplying the power source to the light source module 250, the transparent display panel 210 and the controller 540, and the audio output unit 550 for outputting the audio signal processed from the controller 540 may be arranged.

FIGS. 13 to 16 are views illustrating a cooler to which a transparent display device according to the present invention is provided.

As shown in FIGS. 13 to 16, the transparent display device 20 may include a frame 22 provided with the transparent display panel 24 and the control module. The frame 22 of the transparent display device 20 may be provided to a front surface portion of a predetermined product 10 such as a cooler to serve as a door unit.

Figure 13:
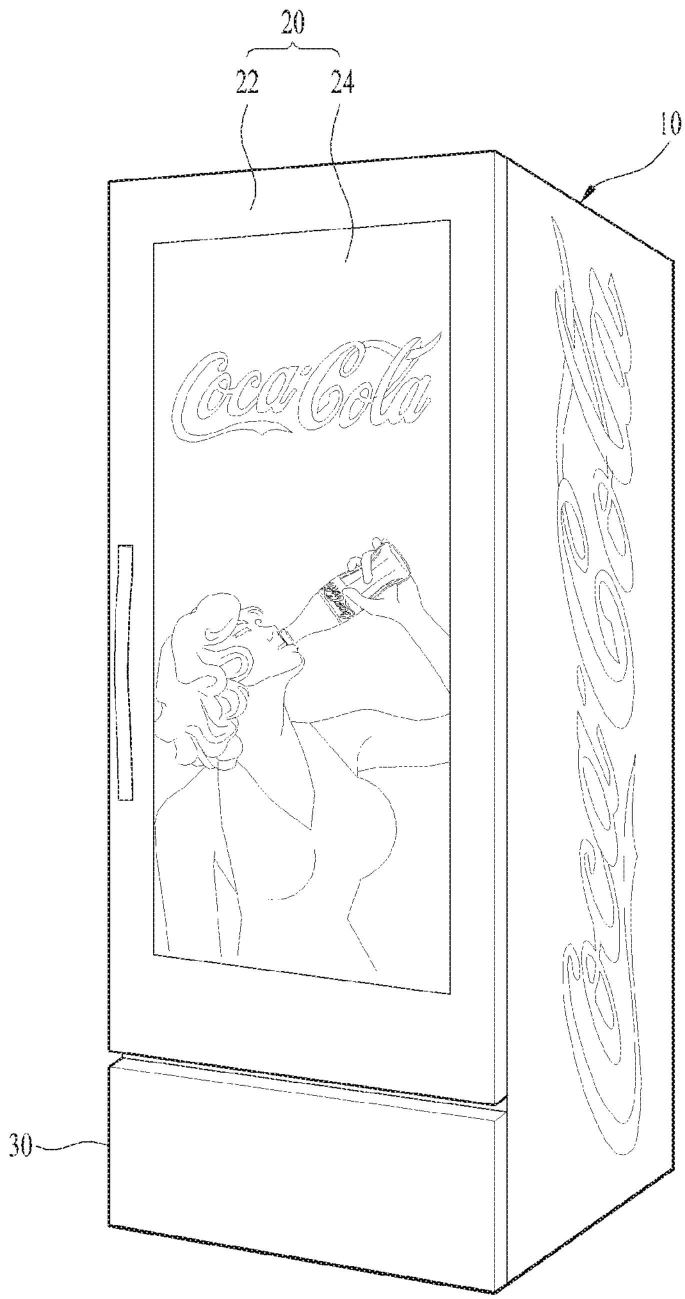
FIGS. 13 to 16 are views illustrating a cooler to which a transparent display device according to the present invention is provided.

In this case, as shown in FIG. 13, the control module may control the transparent display panel 24 to display information related to articles kept in the cooler.

For example, if predetermined beverages are arranged in the cooler, the transparent display panel 24 may display various kinds of information, photos, and images such as moving pictures, which are related to the beverages, to advertise and promote the beverages.

Also, the transparent display device 20 may provide various kinds of information by sensing a touch input of a user through an infrared touch sensor.

As the case may be, the transparent display device 20 may include a camera, and may provide various kinds of information by sensing a gesture operation of the user through the camera.

Figure 14:
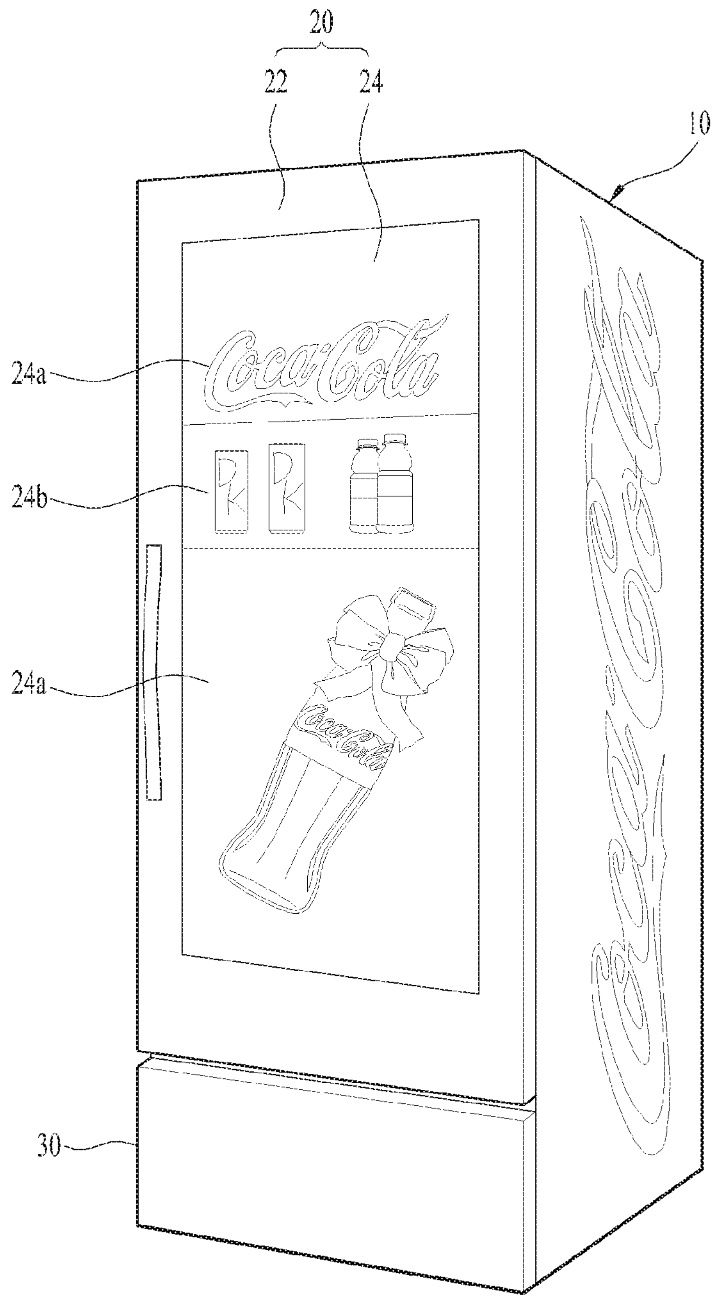

Also, as shown in FIG. 14, the control module may control the transparent display panel 24 to simultaneously display a transmissive area **24*b* where light is transmitted and a non-transmissive area 24*a*** where light is not transmitted.

In this case, the transparent display panel 24 may allow the articles in the cooler to be seen through the transmissive area **24*b* where light is transmitted, and may allow the articles in the cooler not to be seen through the non-transmissive area 24*a***.

That is, the user may partially view the articles in the cooler through the transparent display panel 24.

In this case, the transparent display panel 24 may allow the articles in the cooler to be sequentially seen as the transmissive area **24*b*** is moved depending on time.

For example, on the transparent display panel 24, the transmissive area **24*b*** where light is transmitted may be moved regularly in a given direction, or may be moved irregularly in various directions.

Therefore, since the user may dynamically view some of the articles in the cooler as the transmissive area **24*b*** is moved, the user may highly give attention to the articles, whereby advertisement and promotion effects may be increased.

As another case, the transparent display panel 24 may allow the articles in the cooler to be seen through the transmissive area 24*b* where light is transmitted, and may display various advertisement images related to the articles in the cooler through the non-transmissive area 24*a* where light is not transmitted.

That is, the user may view the articles in the cooler and at the same time view advertisement images related to the articles in the cooler, through the transparent display panel 24.

As still another case, the transparent display panel 24 may allow the entire area as the trasmissive area 24*b* where light is transmitted, so as to allow all of the articles in the cooler to be seen through the transmissive area 24*b* and at the same time display various advertisement images related to the articles in the cooler through the transmissive area 24*b*.

As further still another case, the transparent display panel 24 may allow the entire area as the trasmissive area 24*b* where light is transmitted, so as to allow all of the articles in the cooler to be seen through the transmissive area 24*b* and at the same time display various advertisement images related to the articles in the cooler through some designated position only of the transmissive area 24*b*.

In this way, as shown in FIG. 14, the control module of the transparent display device 20 may control the transparent display panel 24 to display information, which is related to the articles kept in the cooler, on the non-transmissive area 24*a*.

Figure 15:
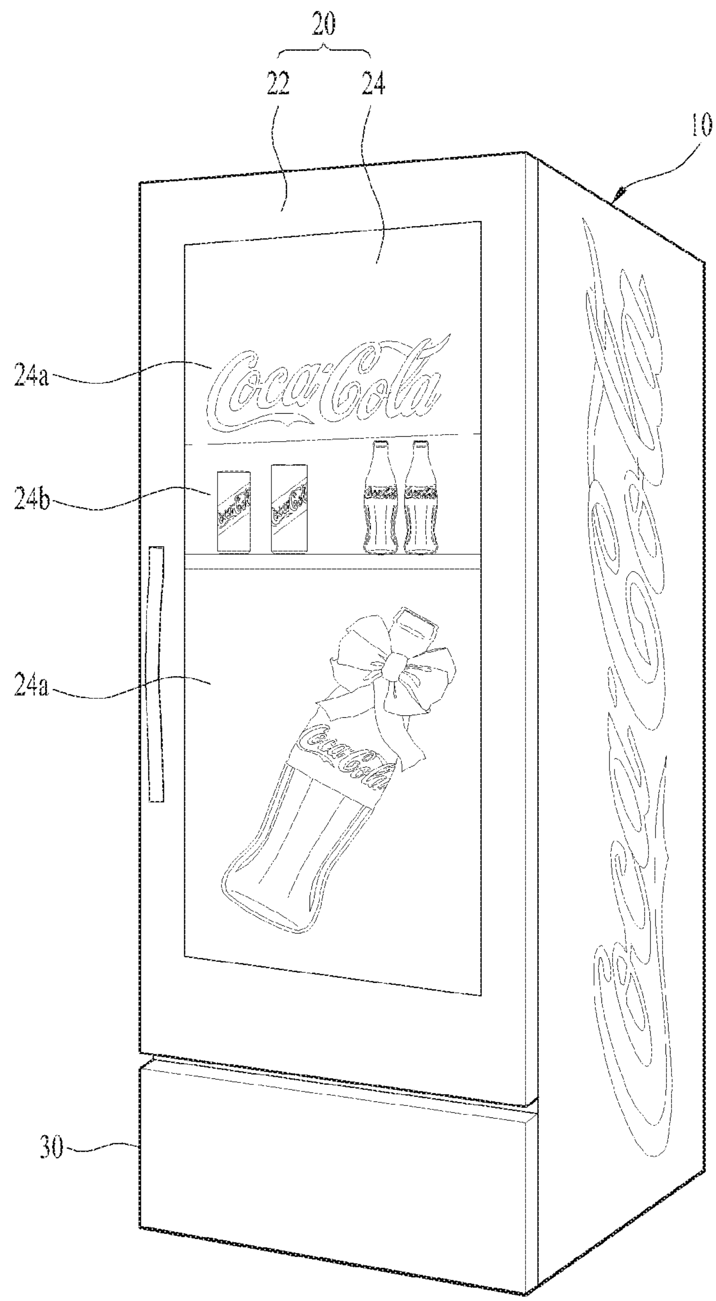

Also, as shown in FIG. 15, the control module of the transparent display device 20 may control the transparent display panel 24 to display information, which is related to articles seen through the transmissive area 24*b* among the articles kept in the cooler, on the non-transmissive area 24*a*.

In this case, the transparent display panel 24 may allow the articles in the cooler to be seen through the transmissive area 24*b* where light is transmitted, and may display various advertisement images related to the articles in the cooler through the non-transmissive area 24*a* where light is not transmitted, wherein the articles displayed on the non-transmissive area 24*a* may be limited to only the articles seen through the transmissive area 24*b*.

That is, the user may view actual articles which are seen, and an advertisement image related to the actual articles, through the transparent display panel 24.

Figure 16:
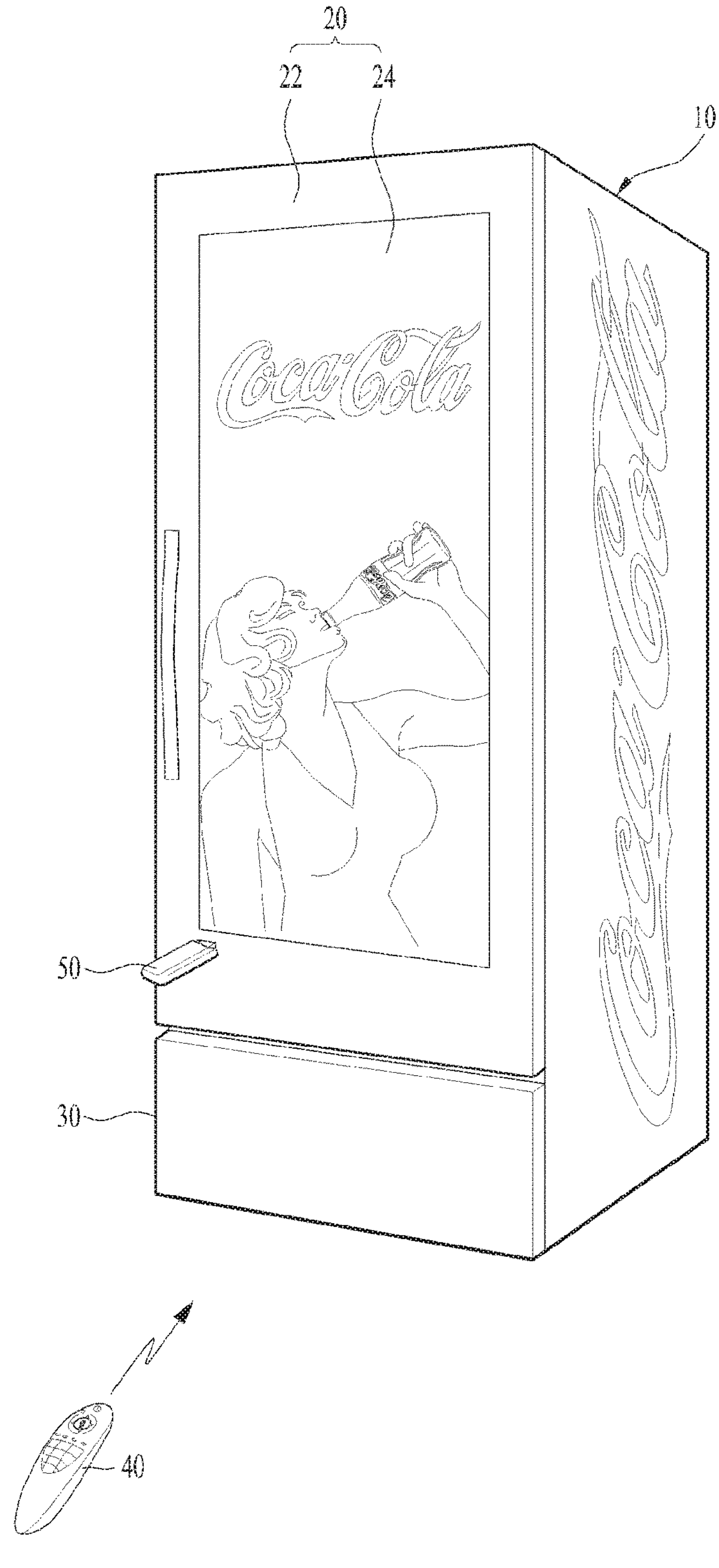

Next, as shown in FIG. 16, the control module of the transparent display device 20 may receive a signal from an external device 50 such as USB through the first interface unit.

For example, the first interface unit may be connected to the external device such as Digital Versatile Disk (DVD), Blu-ray, game device, camera, camcorder, computer (e.g., notebook computer), etc. through wire/wireless cables.

And, the first interface unit may forward video, audio, or data signal, which is externally input through the external device connected thereto, to the control module, and may output the video, audio or data signal processed by the control module to the external device.

Also, the control module of the transparent display device 20 may receive a signal from a remote controller 40 through the second interface eunit.

For example, the second interface unit may receive a control signal such as power on/off and screen setup from the remote controller 40 and gesture and audio information input through the remote controller 40 in accordance with various communication modes such as RF (Radio Frequency) communication mode and IR communication mode, or may transmit the control signal from the control module to the remote controller 40.

Also, the remote controller 40 is intended to transmit a user input to the second interface unit, and may use Bluetooth, RF (Radio Frequency) communication, Infrared Ray (IR) communication, UWB (Ultra WideBand), ZigBee mode, etc.

Also, the remote controller 40 may receive the video, audio or data signal output from the second interface unit and display the received signal therethrough or output audio or vibration.

As the case may be, the control module of the transparent display device 20 may be connected with the wire/wireless network through the third interface unit.

In this case, the third interface unit may provide an interface for connecting the transparent display device 20 with wire/wireless networks including Internet network. The third interface unit may include an Ethernet terminal, for example, for wire network connection. For example, communication standards such as Wireless LAN (WLAN) (Wi-Fi), Wireless broadband (Wibro), World Interoperability for Microwave Access (Wimax), and High Speed Downlink Packet Access (HSDPA) may be used for the wireless network connection.

Subsequently, the third interface unit may transmit or receive data to or from another user or another electronic device through the connected network or another network linked to the connected network.

As another case, the audio output unit for outputting the audio signal may be arranged at the lower end of the cooler product 10 to provide reality and dynamic power to a contents image displayed by the transparent display device.

Also, the cooler product 10 to which the transparent display device of the present invention is provided may simply display and change various contents images through the first, second and third interface units, and may easily manage volume control, picture quality control and contents change of the contents images through the remote controller 40.

As described above, according to the present invention, the frame in which the transparent display panel and the control module are arranged is provided to cover the front surface of the predetermined product and rotatably moved when the inside of the product is opened and closed, whereby the frame may serve as a door unit and at the same time perform various functions such as article information in the product and advertisement.

Also, according to the present invention, the control module and the light source module are arranged outside the transparent cover unit, whereby circuit parts may easily be repaired and exchanged with other ones, and mass production may be performed.

Also, according to the present invention, the transparent display panel from which a polarizer and a light guide plate are removed may be used, whereby installation of the transparent display panel is simple due to its light weight, and the production cost may be reduced.

Also, according to the present invention, as the interface unit connected to the external device and the remote controller may be arranged, various contents received from the external device may be displayed, and luminance may be controlled in accordance with the control signal received from the remote controller, whereby user convenience is excellent.

And, according to the present invention, as the audio output unit may be arranged, sound of a contents image displayed on the transparent display panel may be provided, whereby it is easy to advertise and promote the articles.

Therefore, according to the present invention, the articles, such as beverages, in the product may be displayed together with advertisement contents to attract consumers' attention and improve a purchase desire of the consumers.

Mode for Carrying Out the Invention

The configuration and methods of the aforementioned embodiments are not limited to the transparent display device disclosed in this specification, and all or some of the aforementioned embodiments may selectively be configured in combination, whereby various modifications may be made in the embodiments.

Meanwhile, the method for operating the transparent display device disclosed in this specification may be implemented in a recording medium that can be read by a processor provided in the transparent display device as a code that may be read by the processor. Examples of the recording medium that can be read by the processor include all kinds of recording media in which data that can be read by the processor are stored. Examples of the recording medium include a ROM, a RAM, CD-ROM, a magnetic tape, a floppy disk, and an optical data memory. Also, another example of the recording medium may be implemented in a type of carrier wave (for example, transmission through Internet). Also, the recording medium that can be read by the processor may be distributed in a computer system connected to the network, whereby the code that can be read by the processor may be stored and implemented in a distributed mode.

Meanwhile, it will be apparent to those skilled in the art that the present invention can be embodied in other specific forms without departing from the spirit and essential characteristics of the invention. Thus, the above embodiments are to be considered in all respects as illustrative and not restrictive. The scope of the invention should be determined by reasonable interpretation of the appended claims and all change which comes within the equivalent scope of the invention are included in the scope of the invention.

INDUSTRIAL APPLICABILITY

The present invention relates to a transparent display device attached to a predetermined product, displaying article information in the product, advertisement, etc. Therefore, the present invention may have industrial applicability.

What is claimed is:

1. A transparent display device comprising:

a frame including an opening;

a transparent display panel arranged at the opening;

a first transparent cover arranged at a front side of the transparent display panel and separated from the transparent display panel by a first interval to form a first air gap;

a second transparent cover arranged at a rear side of the transparent display panel and separated from the transparent display panel by a second interval to form a second air gap; and a control module arranged in an area of the frame and configured to control the transparent display panel, wherein the frame forms a door unit of a predetermined product, wherein the door unit is configured to be hingedly moved to open or close the door unit to provide access to an inside of the predetermined product, and wherein the first air gap is wider than the second air gap.

2. The transparent display device according to claim 1, wherein the frame includes a front door frame having a first opening, and a rear door frame having a second opening, connected to the front door frame.

3. The transparent display device according to claim 2, wherein the first opening has an area different from that of the second opening.

4. The transparent display device according to claim 2, wherein the front door frame includes an extension frame extended toward the rear door frame and fastened into the rear door frame, the extension frame being provided with a line space through which a connection line passes.

5. The transparent display device according to claim 2, wherein the rear door frame is fastened into a buffer member arranged in a direction of the predetermined product.

6. The transparent display device according to claim 2, wherein the rear door frame includes at least one light source module arranged at one side facing the second opening, wherein a length of the light source is longer than a side length of the transparent display panel.

7. The transparent display device according to claim 1, wherein a first spacer for controlling an interval between the first and second transparent covers and an interval between the first transparent cover and the transparent display panel is arranged at corner areas of the first and second transparent covers, and a second spacer for controlling an interval between the second transparent cover and the transparent display panel is arranged at the corner area of the second transparent cover, wherein the first spacer comprises a first support bar configured to control the interval between the first and second transparent covers and a second support bar configured to control the interval between the first transparent cover and the transparent display panel.

8. The transparent display device according to claim 1, wherein the control module includes:

a first interface unit for receiving a signal from an external device;

a second interface unit for receiving a signal from a remote controller; and a controller for controlling the transparent display panel in accordance with the signals received from the first and second interface units.

9. The transparent display device according to claim 8, wherein the control module further includes an audio output unit for outputting an audio signal processed from the controller.

10. The transparent display device according to claim 1, wherein the control module controls luminance of the transparent display panel when the frame is rotatably moved to open and close the door unit to provide access to the inside of the predetermined product.

11. The transparent display device according to claim 1, wherein the control module controls the transparent display panel to display information related to articles kept in the predetermined product.

12. The transparent display device according to claim 1, wherein the control module controls the transparent display panel to simultaneously display a transmissive area where light is transmitted and a non-transmissive area where light is not transmitted.

13. The transparent display device according to claim 12, wherein the control module controls the transparent display panel to display information, which is related to articles kept in the predetermined product, on the non-transmissive area.

14. The transparent display device according to claim 12, wherein the control module controls the transparent display panel to display information, which is related to articles seen through the transmissive area among the articles kept in the predetermined product, on the non-transmissive area.

15. The transparent display device according to claim 1, further comprising a cover unit that includes a power supply for supplying a power source to the transparent display panel and the control module.

16. The transparent display device according to claim 15, wherein the cover unit is arranged to be spaced apart from the frame at a certain interval and is provided to a lower end of the predetermined product.

17. The transparent display device according to claim 15, wherein the cover unit is fixed to the lower end of the predetermined product when the frame is rotatably moved to open and close the door unit to provide access to the inside of the predetermined product.

18. The transparent display device according to claim 15, wherein the cover unit further comprises an audio output unit for outputting the audio signal processed from the controller.

19. The transparent display device according to claim 1, wherein the first transparent cover comprises a tempered glass material and the second transparent cover comprises an insulating material.

20. The transparent display device according to claim 1, further comprising an anti-reflection (AR) coating film formed on a front surface of the first transparent cover.

* * * * *